US011605718B2

(12) United States Patent
Lu

(10) Patent No.: US 11,605,718 B2
(45) Date of Patent: Mar. 14, 2023

(54) METHOD FOR PREPARING SEMICONDUCTOR STRUCTURE HAVING BURIED GATE ELECTRODE WITH PROTRUDING MEMBER

(71) Applicant: NANYA TECHNOLOGY CORPORATION, New Taipei (TW)

(72) Inventor: Tseng-Fu Lu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/526,125

(22) Filed: Nov. 15, 2021

(65) Prior Publication Data

US 2022/0093760 A1 Mar. 24, 2022

Related U.S. Application Data

(62) Division of application No. 17/030,982, filed on Sep. 24, 2020, now Pat. No. 11,417,744.

(51) Int. Cl.
*H01L 29/423* (2006.01)
*H01L 29/51* (2006.01)
(Continued)

(52) U.S. Cl.
CPC ........ *H01L 29/4236* (2013.01); *H01L 29/401* (2013.01); *H01L 29/4916* (2013.01);
(Continued)

(58) Field of Classification Search
CPC ......... H01L 29/06; H01L 29/40; H01L 29/49; H01L 29/51; H01L 29/66; H01L 29/78;
(Continued)

(56) References Cited

U.S. PATENT DOCUMENTS 6,277,736 B1 * 8/2001 Chen ................. H01L 21/32137
438/653
2006/0079064 A1 4/2006 Seidl
(Continued)

FOREIGN PATENT DOCUMENTS

TW 201545352 A 12/2015
TW 201709415 A 3/2017
(Continued)

OTHER PUBLICATIONS

Office Action dated Mar. 30, 2022 related to Taiwanese Application No. 110122730.
(Continued)

*Primary Examiner* — Chuong A Luu
(74) *Attorney, Agent, or Firm* — Xuan Zhang

(57) ABSTRACT

The present disclosure provides a method for preparing a semiconductor structure. The method includes providing a substrate comprising a first top surface; forming an isolation region in the substrate to surround an active region; implanting a plurality of dopants into the substrate to form a first impurity region, a second impurity region and a third impurity region in the active region; forming a gate trench in the active region; forming a first barrier layer on a portion of a sidewall of the gate trench; forming a first gate material in the gate trench, wherein the first gate material comprises a first member surrounded by the first barrier layer; forming a second barrier layer on the first barrier layer and the first gate material; forming a second gate material on the second barrier layer; and forming a gate insulating material on the second gate material.

7 Claims, 21 Drawing Sheets

(51) Int. Cl.
  *H01L 29/49* (2006.01)
  *H01L 29/66* (2006.01)
  *H01L 29/40* (2006.01)
  *H01L 29/78* (2006.01)
  *H01L 27/108* (2006.01)

(52) U.S. Cl.
  CPC ...... *H01L 29/518* (2013.01); *H01L 29/66621* (2013.01); *H01L 29/78* (2013.01); *H01L 27/108* (2013.01)

(58) Field of Classification Search
  CPC ................ H01L 29/401; H01L 29/423; H01L 29/7813; H01L 29/7825; H01L 29/7827; H01L 29/7831; H01L 29/7832; H01L 29/4941; H01L 29/4925; H01L 29/4958; H01L 29/66613; H01L 29/66628; H01L 29/0649; H01L 29/0653; H01L 29/4236; H01L 29/4916; H01L 29/518; H01L 29/66621; H01L 27/108; H01L 27/10823; H01L 27/10876; H01L 29/4238; H01L 29/42376; H01L 29/4966; H01L 21/28; H01L 21/28114; H01L 21/28061
  USPC .................................. 438/259, 270, 271, 589
  See application file for complete search history.

(56) References Cited

U.S. PATENT DOCUMENTS

| 2008/0303081 | A1  | 12/2008 | Hshieh |
| 2016/0380060 | A1  | 12/2016 | Kim |
| 2017/0047421 | A1  | 2/2017  | Oh et al. |
| 2017/0338317 | A1  | 11/2017 | Kim |
| 2018/0151580 | A1* | 5/2018  | Wu .................... H01L 29/42376 |
| 2018/0174845 | A1* | 6/2018  | Jang ...................... H01L 27/228 |
| 2020/0091303 | A1  | 3/2020  | Nam |

FOREIGN PATENT DOCUMENTS

| TW | 201926424 A | 7/2019 |
| TW | 202013603 A | 4/2020 |
| TW | 202025388 A | 7/2020 |
| TW | 202029350 A | 8/2020 |

OTHER PUBLICATIONS

Office Action dated Jun. 8, 2022 related to Taiwanese Application No. 110122730.

* cited by examiner

METHOD FOR PREPARING SEMICONDUCTOR STRUCTURE HAVING BURIED GATE ELECTRODE WITH PROTRUDING MEMBER

CROSS-REFERENCE TO RELATED APPLICATION

This application is a divisional application of U.S. Non-Provisional application Ser. No. 17/030,982 filed Sep. 24, 2020, which is incorporated herein by reference in its entirety.

TECHNICAL FIELD

The present disclosure relates to a method for preparing a semiconductor structure, and more particularly, to a method for preparing a semiconductor structure having a buried gate electrode with a protruding member.

DISCUSSION OF THE BACKGROUND

A dynamic random access memory (DRAM) is a type of semiconductor arrangement for storing bits of data in separate capacitors within an integrated circuit (IC). DRAMs commonly take the form of trench capacitor DRAM cells or stacked capacitor DRAM cells. In the stacked capacitor DRAM cells, the capacitors are formed above transistors. An advanced method for preparing a buried gate electrode involves building a gate electrode of a transistor and a word line in a trench in an active region (AA) comprising shallow trench isolation (STI)oxide.

Over the past few decades, as semiconductor fabrication technology has continued to improve, sizes of electronic devices have been correspondingly reduced. As the size of a cell transistor is reduced to a few nanometers in length, short-channel effects may occur, which may result in a significant drop in the performance of the cell transistors.

To overcome the performance issue, there is a significant need to improve the fabrication method of transistors in a semiconductor structure.

This Discussion of the Background section is provided for background information only. The statements in this Discussion of the Background are not an admission that the subject matter disclosed in this Discussion of the Background section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure comprises a substrate comprising a first top surface; an isolation region disposed in the substrate; an active region surrounded by the isolation region; a gate trench disposed in the active region; a first barrier layer disposed on a portion of a sidewall of the gate trench; a first gate material disposed in the gate trench, wherein the first gate material comprises a first member surrounded by the first barrier layer and a second member extending from the first member toward the first top surface; a second barrier layer disposed on the first barrier layer and the first gate material; a second gate material disposed on the second barrier layer; and a gate insulating material disposed on the second gate material.

In some embodiments, the first gate material includes aluminum (Al), copper (Cu), tungsten (W) or titanium (Ti).

In some embodiments, the second gate material includes doped or undoped polycrystalline silicon.

In some embodiments, the first barrier layer and the second barrier layer include tantalum (Ta), titanium (Ti), tantalum nitride (TaN), titanium nitride (TiN) or titanium silicon nitride (TiSiN).

In some embodiments, the gate insulating material includes silicon nitride ($Si_3N_4$).

In some embodiments, the first member has a first width varied with a first height along the vertical extension of the first member, and the second member has a second width varied with a second height along the vertical extension of the second member.

In some embodiments, the first gate material is encased by the first barrier layer and the second barrier layer.

In some embodiments, the second gate material has a second top surface substantially lower than the first top surface of the substrate.

In some embodiments, the gate insulating material has a third top surface substantially coplanar with the first top surface of the substrate.

In some embodiments, the first barrier layer has a fourth top surface substantially lower than the first top surface of the substrate, and the first member has a fifth top surface adjacent to and substantially coplanar with the fourth top surface of the first barrier layer.

In some embodiments, the second member has a sixth top surface surrounded by and extending from the fifth top surface of the first member.

Another aspect of the present disclosure provides a semiconductor structure. The semiconductor structure comprises a substrate comprising a first top surface; an isolation region disposed in the substrate; an active region surrounded by the isolation region; a gate trench disposed in the active region; a first barrier layer disposed on a portion of a sidewall of the gate trench; a first gate material disposed in the gate trench, wherein the first gate material comprises a first member surrounded by the first barrier layer, and a second member extending from the first member toward the first top surface and having a substantially consistent width along a height of the second member; a second barrier layer disposed on the first barrier layer and the first gate material; a second gate material disposed on the second barrier layer; and a gate insulating material disposed on the second gate material.

In some embodiments, a sidewall of the second member is substantially perpendicular to a second top surface of the first member and a third top surface of the second member.

Still another aspect of the present disclosure provides a method for preparing a semiconductor structure. The method comprises providing a substrate comprising a first top surface; forming an isolation region in the substrate to surround an active region; implanting a plurality of dopants into the substrate to form a first impurity region, a second impurity region and a third impurity region in the active region; forming a gate trench in the active region; forming a first barrier layer on a portion of a sidewall of the gate trench; forming a first gate material in the gate trench, wherein the first gate material comprises a first member surrounded by the first barrier layer and a second member extending from the first member toward the first top surface; forming a second barrier layer on the first barrier layer and the first gate material; forming a second gate material on the second barrier layer; and forming a gate insulating material on the second gate material.

In some embodiments, the formation of the first barrier layer comprises: conformally depositing the first barrier layer within the gate trench; and removing a portion of the first barrier layer within the gate trench.

In some embodiments, the formation of the first gate material comprises: depositing the first gate material to completely fill the gate trench; and removing a portion of the first gate material within the gate trench to form the first member and the second member.

In some embodiments, the removal of a portion of the first barrier layer includes using a first etchant, and the removal of a portion of the first gate material includes using a second etchant, wherein the first etchant is different from the second etchant.

In some embodiments, the forming of the second barrier layer comprises encasing the first gate material in the first barrier layer and the second barrier layer.

In some embodiments, the forming of the second gate material comprises depositing the second gate material to completely cover the first gate material and partially fill the gate trench, wherein the second gate material has a second top surface substantially lower than the first top surface of the substrate.

In some embodiments, the forming of the gate insulating material comprises depositing the gate insulating material to completely cover the second gate material and partially fill the gate trench, wherein the gate insulating material has a third top surface substantially coplanar with the first top surface of the substrate.

The present disclosure provides a semiconductor structure including a buried dual gate electrode. The buried dual gate electrode includes a metal gate electrode and a polysilicon gate electrode, wherein the metal gate electrode includes a protruding member. The protruding member of the metal gate electrode allows the removal of a portion of the metal gate electrode, to produce space for the polysilicon gate electrode, without removing a great amount of the metal gate electrode. As a result, gate-induced drain leakage (GIDL) can be suppressed because of the low work function of the polysilicon gate electrode, while the total gate resistance of the buried gate electrode is prevented from excessively increasing due to the greater amount material of the metal gate electrode.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
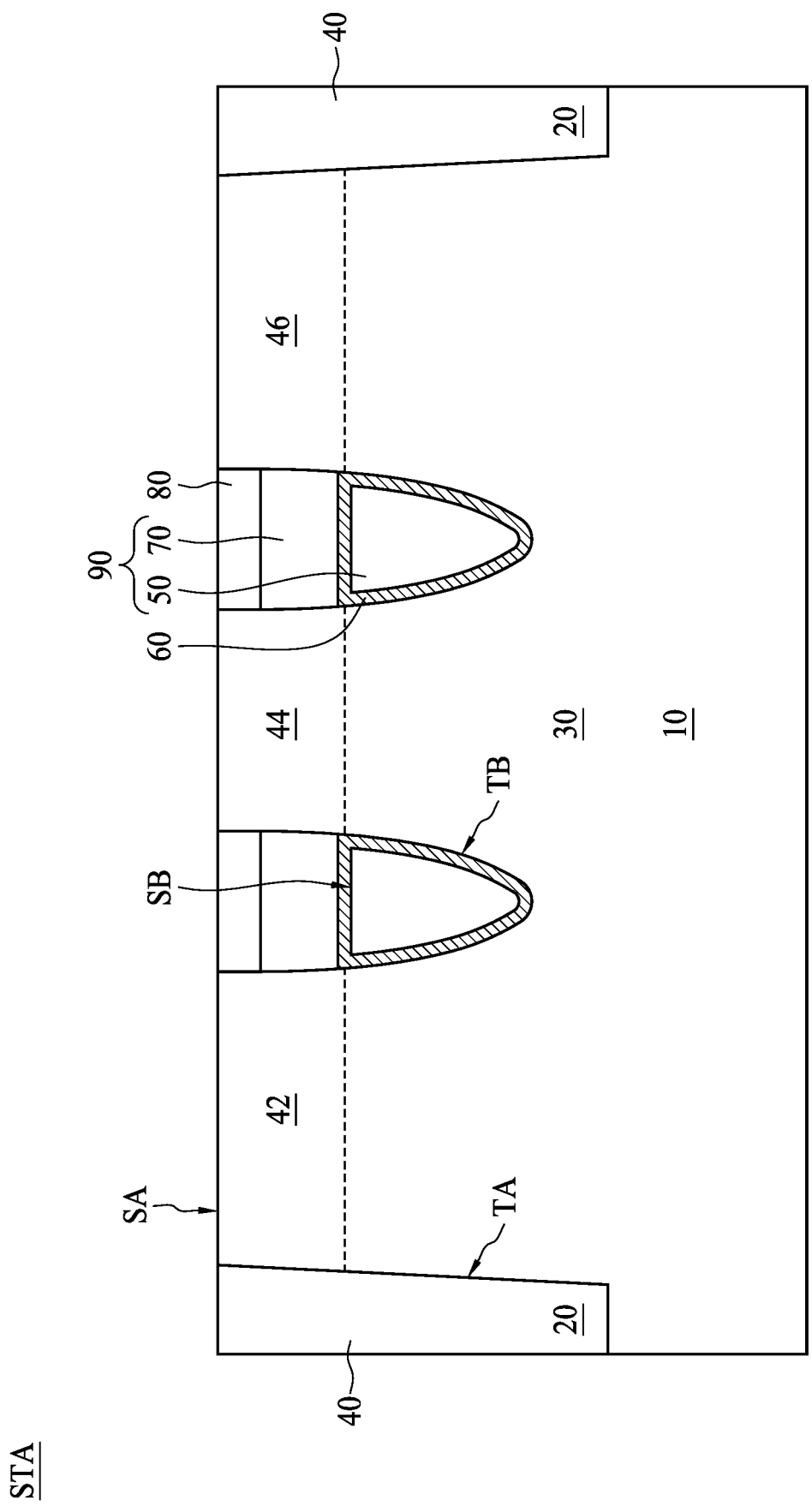
FIG. 1 is a schematic cross-sectional view of a semiconductor structure STA, in accordance with one comparative embodiment.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

When a typical transistor is formed on a semiconductor substrate, a gate is formed on the semiconductor substrate and implanted with dopants on both sides of the gate to form a source and a drain. As the data storage capacity of the semiconductor memory device increases and the degree of integration increases, the size of each unit cell is required to be scaled down. That is, design rules of capacitors and transistors included in the unit cell have been reduced. As a result, the channel length of the cell transistors has gradually decreased, resulting in short channel effects (SCE) and gate-induced drain leakage (GIDL). The short channel effects occur when the channel length is comparable to the depletion layer widths of the source and drain junctions. These short channel effects include, in particular, draininduced barrier lowering (DIBL), velocity saturation, quantum confinement and hot carrier degradation.

The GIDL causes one of the most significant performance issues. The GIDL current occurs due to electrons from the valence band tunneling to the conduction band as a result of excessive band bending in the gate/drain overlap region. As the design rule decreases to less than 100 nm, the layer thickness of the gate oxide must continue to be reduced in order to provide for suitable gate control over the subthreshold region. In addition, doping concentration in the channel and source/drain regions must be increased to improve punch-through characteristics. However, it has been observed that by increasing the doping concentration in the channel region, the interface electric field at the storage node (SN) junction also increases, resulting in more band bending and, hence, even more GIDL current. Thus, difficulties exist in providing a scaled-down semiconductor device having a suitable balance between high current driving capability and low GIDL current.

A variety of methods have been proposed for reducing the GIDL current, such as a lighter junction doping concentration, a greater recess depth of buried gate electrodes, and others. Recently, the buried gate electrode with metal/polysilicon gate (dual work functions) has been published and incorporated in a DRAM roadmap. The purpose of such methods is to reduce the GIDL current by using less work-function material (polysilicon) for the purpose of reducing the band-to-band electric field.

A drawback to such approach is that resistance of the buried gate electrode will be significantly increased because the resistance of polysilicon is much greater than the resistance of metals. Therefore, in order to reduce the resistance of the buried gate electrode with a metal/polysilicon gate, the present disclosure provides a semiconductor structure including a buried gate electrode with its metal gate electrode mound-shaped.

FIG. 1 is a schematic cross-sectional view of a semiconductor structure STA, in accordance with one comparative embodiment. The semiconductor structure STA mainly includes a substrate 10, an isolation region 20 in the substrate 10, and an active region 30 surrounded by the isolation region 20. The substrate 10 includes a top surface SA. The isolation region 20 includes a dielectric material 40 deposited in an isolation trench TA. Multiple gate trenches TB are disposed in the active region 30. The active region 30 includes a first impurity region 42, a second impurity region 44 and a third impurity region 46. The first impurity region 42 and the second impurity region 44 are divided by one of the gate trenches TB, and the second impurity region 44 and the third impurity region 46 are divided by the other gate trench TB. A first gate material 50 including various metals such as aluminum (Al), copper (Cu), tungsten (W), titanium (Ti) or other suitable materials with a proper work function is disposed at a lower portion of the gate trench TB. A second gate material 70 including doped or undoped polycrystalline silicon is disposed at a middle portion of the gate trench TB and covers the first gate material 50 encased by a barrier layer 60. The barrier layer 60 includes various materials such as tantalum (Ta), titanium (Ti), tantalum nitride (TaN), titanium nitride (TiN), titanium silicon nitride (TiSiN) or other suitable materials. Because the barrier layer 60 completely separates the first gate material 50 from the second gate material 70, the reaction between the first gate material 50 and the second gate material 70 to form silicide can be prevented. A gate insulating material 80 including silicon nitride ($Si_3N_4$) or other suitable materials is disposed at an upper portion of the gate trench T2 and covers the second gate material 70.

Still referring to FIG. 1, the first gate material 50 may serve as a metal gate electrode and the second gate material 70 may serve as a polysilicon gate electrode. The resistance of the first gate material 50 is generally lower than that of the second gate material 70 while the work function of the first gate material 50 is generally greater than that of the second gate material 70. Therefore, the first gate material 50 and the second gate material 70 together form a buried gate electrode 90, which is a gate electrode with dual work functions. The gate insulating material 80 protects the buried gate electrode 90 and prevents an electrical short circuit from occurring. One of the buried gate electrodes 90, the first impurity region 42 and the second impurity region 44 form a transistor in a DRAM device. The other of the buried gate electrodes 90, the second impurity region 44 and the third impurity region 46 also form a transistor in the DRAM device. In general, the GIDL occurs at an interface between the first gate material 50 (metal gate electrode) and an impurity region 42, 44 or 46. Since the second gate material 70 has a low work function, the interface electric field between the second gate material 70 (polysilicon gate electrode) and an impurity region 42, 44 or 46 is low. Therefore, it may be possible to prevent the GIDL from occurring at an interface between the second gate material 70 and an impurity region 42, 44 or 46.

However, although the GIDL may be suppressed with the use of the polysilicon gate electrode, the introduction of the second gate material 70 into the buried gate electrode 90 significantly decreases the volume of the first gate material 50 that can be used. Compared to a buried gate electrode which is purely a metal gate electrode, the entire gate resistance of the buried gate electrode 90 in the comparative embodiment is still large due to the high resistance of the second gate material 70 in the buried gate electrode 90.

Figure 2:
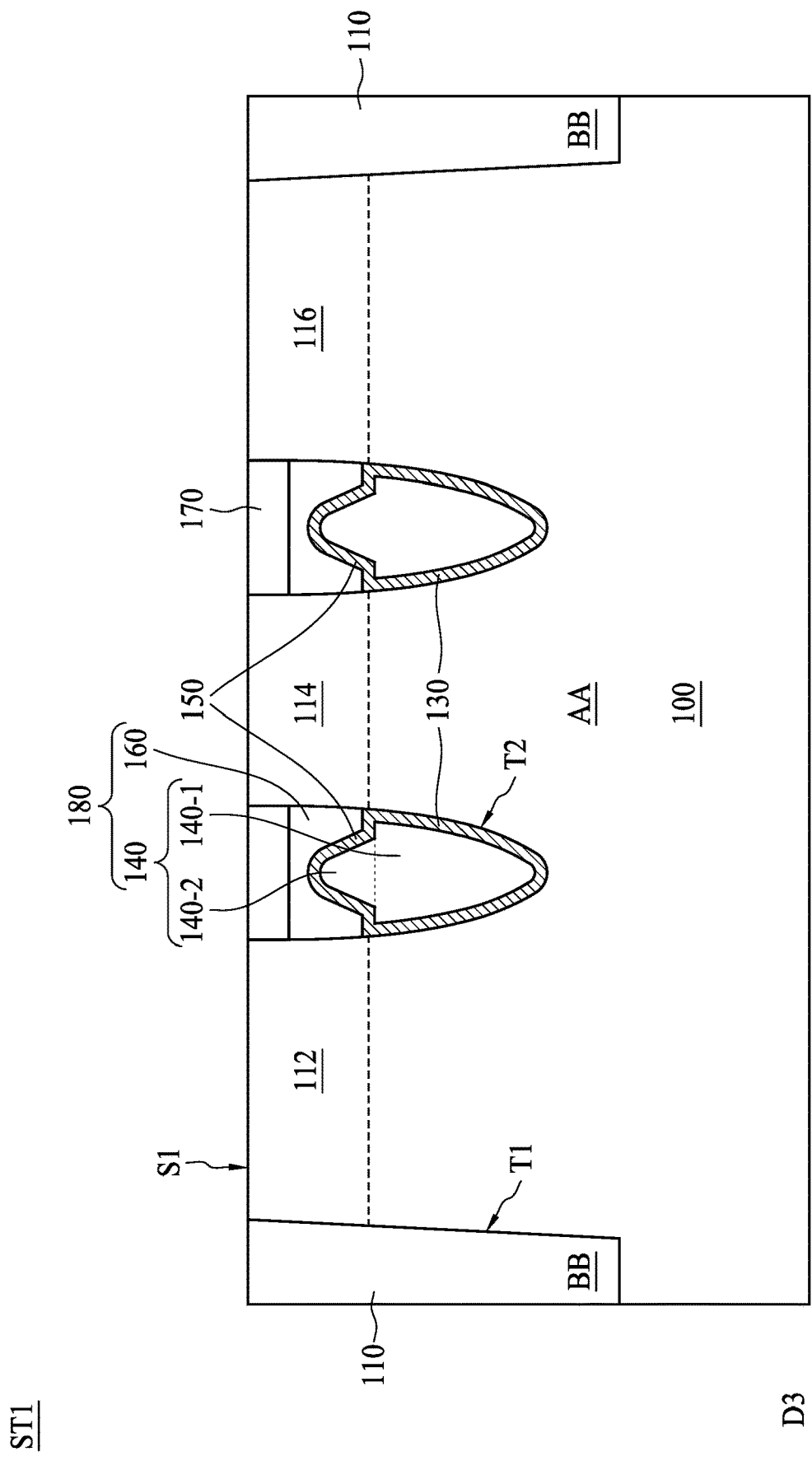
FIG. 2 is a schematic cross-sectional view of a first semiconductor structure ST1, in accordance with some embodiments of the present disclosure.

One aspect of the present disclosure provides a semiconductor structure including a buried gate electrode, wherein the buried gate electrode has a protruding member. FIG. 2 is a schematic cross-sectional view of a first semiconductor structure ST1, in accordance with some embodiments of the present disclosure. The semiconductor structure ST1 mainly includes a substrate 100, an isolation region BB in the substrate 100, and an active region AA surrounded by the isolation region BB. The substrate 100 includes a top surface S1. The isolation region BB includes a dielectric material 110 deposited in an isolation trench T1.

Multiple gate trenches T2 are disposed in the active region AA. The active region AA includes a first impurity region 112, a second impurity region 114 and a third impurity region 116. The first impurity region 112 and the second impurity region 114 are divided by one of the gate trenches T2, and the second impurity region 114 and the third impurity region 116 are divided by the other gate trench T2.

A first gate material 140 is disposed at a lower portion of the gate trench T2. The first gate material 140 includes a first member 140-1 and a second member 140-2 on the first member 140-1. The second member 140-2 is a protruding member extending from the first member 140-1 toward the top surface S1 of the substrate 100. The first member 140-1 and the second member 140-2 have different diameters with different heights. In some embodiments, the second member 140-2 has a dome shape.

The first member 140-1 is surrounded by a first barrier layer 130. Moreover, the first member 140-1 and the second member 140-2 are covered by a second barrier layer 150. As a result, the first gate material 140 is completely encased by the first barrier layer 130 and the second barrier layer 150. In some embodiments, the first barrier layer 130 and the second barrier layer 150 are integrally formed. A second gate material 160 is disposed at a middle portion of the gate trench T2 and covers the first gate material 140. The second barrier layer 150 is interposed between the second gate material 160 and the first gate material 140. A gate insulating material 170 is disposed at an upper portion of the gate trench T2 and covers the second gate material 160.

Still referring to FIG. 2, the first barrier layer 130 and the second barrier layer 150 include various materials such as tantalum (Ta), titanium (Ti), tantalum nitride (TaN), titanium nitride (TiN), titanium silicon nitride (TiSiN) or other suitable materials. The gate insulating material 170 includes silicon nitride ($Si_3N_4$) or other suitable materials. The first gate material 140 includes various metals such as aluminum (Al), copper (Cu), tungsten (W), titanium (Ti) or other suitable materials. The second gate material 160 includes doped or undoped polycrystalline silicon. The first gate material 140 is used as a metal gate electrode and the second gate material 160 is used as a polysilicon gate electrode. The first gate material 140 and the second gate material 160 within the gate trench T2 together form a buried gate electrode 180 in the active region AA. In the buried gate electrode 180, the second member 140-2 of the first gate material 140 extends toward the second gate material 160. The buried gate electrode 180, the first impurity region 112 and the second impurity region 114 together form a transistor in a DRAM device. The other of the buried gate electrodes 180, the second impurity region 114 and the third impurity region 116 also form a transistor in the DRAM device. The buried gate electrode 180 extends in a first direction D1 in the substrate 100. In addition, multiple buried gate structures 180 are arranged in parallel along a second direction D2 substantially perpendicular to the first direction D1.

Figure 3:
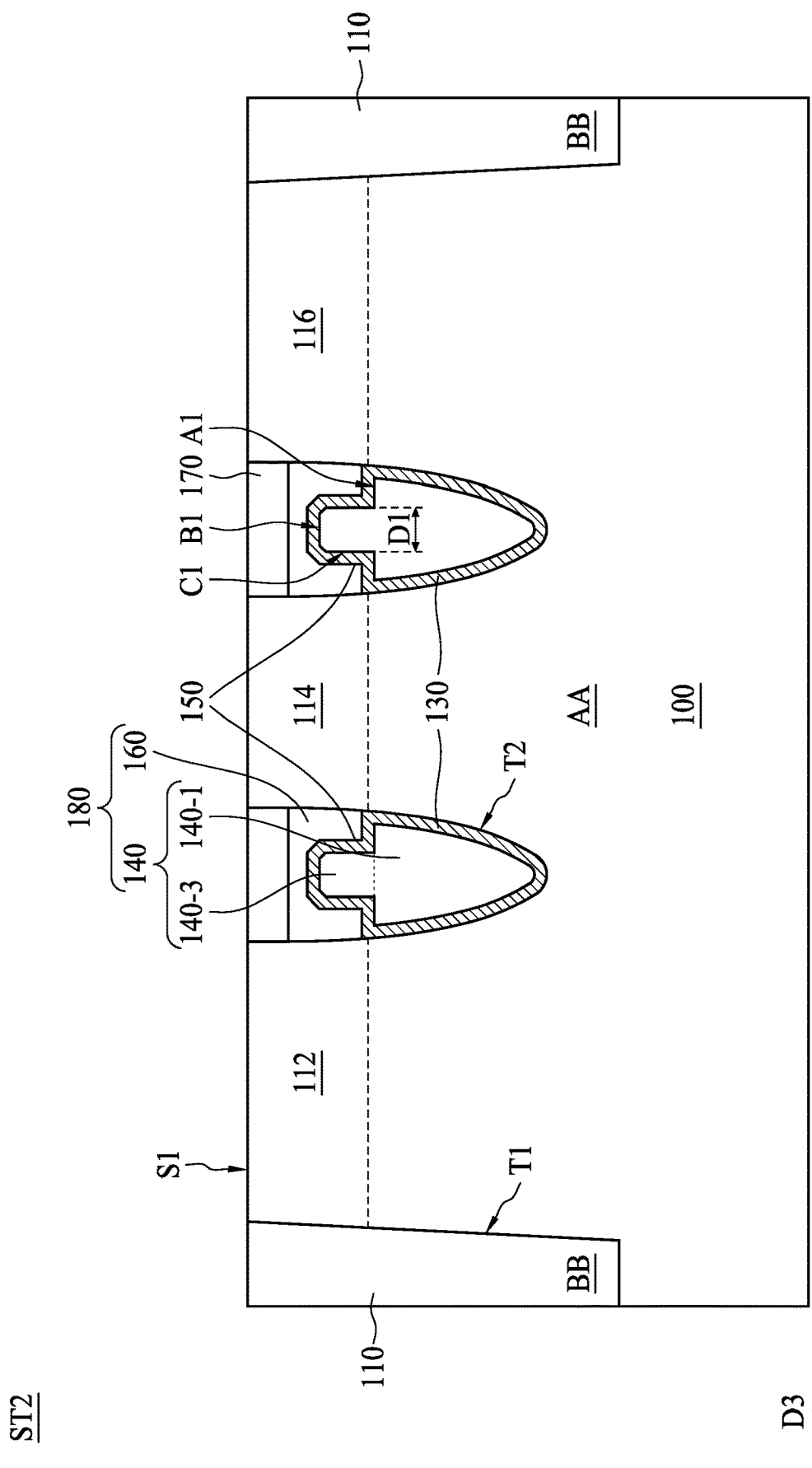
FIG. 3 is a schematic cross-sectional view of a second semiconductor structure ST2, in accordance with some embodiments of the present disclosure.

FIG. 3 is a schematic cross-sectional view of a second semiconductor structure ST2, in accordance with some embodiments of the present disclosure. The second semiconductor structure ST2 is basically the same as the first semiconductor structure ST1, except that the shape of a second member 140-3 of the second semiconductor structure ST2 is different from the shape of the second member 140-2 of the first semiconductor structure ST1. Specifically, the second member 140-3 has a substantially consistent width D1 along its vertical extension. A sidewall Cl of the second member 140-3 is substantially perpendicular to a top surface A1 of the first member 140-1 and a top surface B1 of the second member 140-3.

Figure 4:
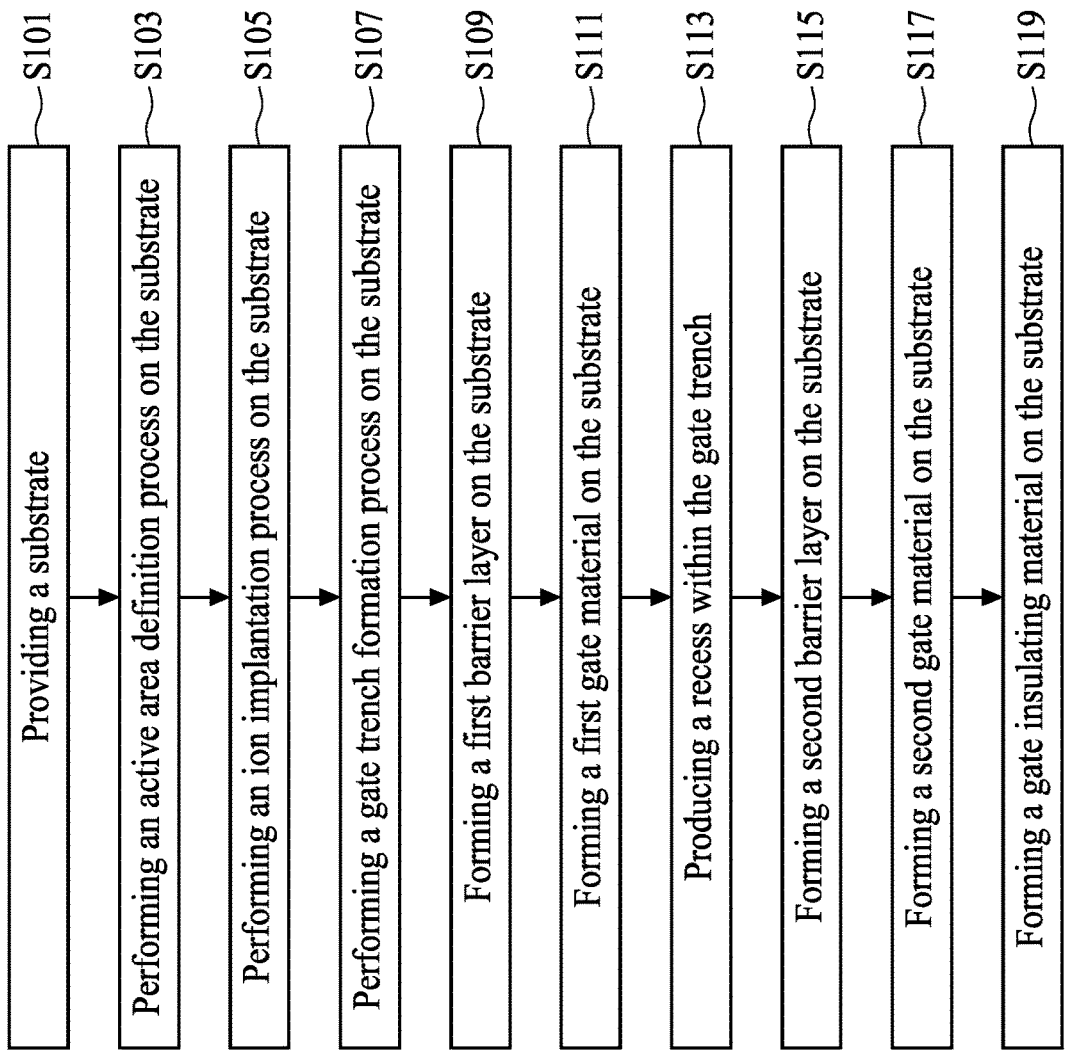
FIG. 4 is a flow diagram of a method for fabricating the first semiconductor structure in FIG. 2 and the second semiconductor structure in FIG. 3, in accordance with some embodiments of the present disclosure.

Still another aspect of the present disclosure provides a method for fabricating a semiconductor structure including a buried dual gate electrode, wherein the buried dual gate electrode has a protruding member of a metal gate electrode. FIG. 4 is a flow diagram of a method 200 for fabricating the first semiconductor structure ST1 in FIG. 2 and the second semiconductor structure ST2 in FIG. 3, in accordance with some embodiments of the present disclosure. Specifically, the method 200 may be utilized to fabricate a transistor with buried gate structures. FIG. 5 to FIG. 21 are schematic cross-sectional views illustrating sequential fabrication stages according to the method 200 in FIG. 4, in accordance with some embodiments of the present disclosure.

Figure 5:
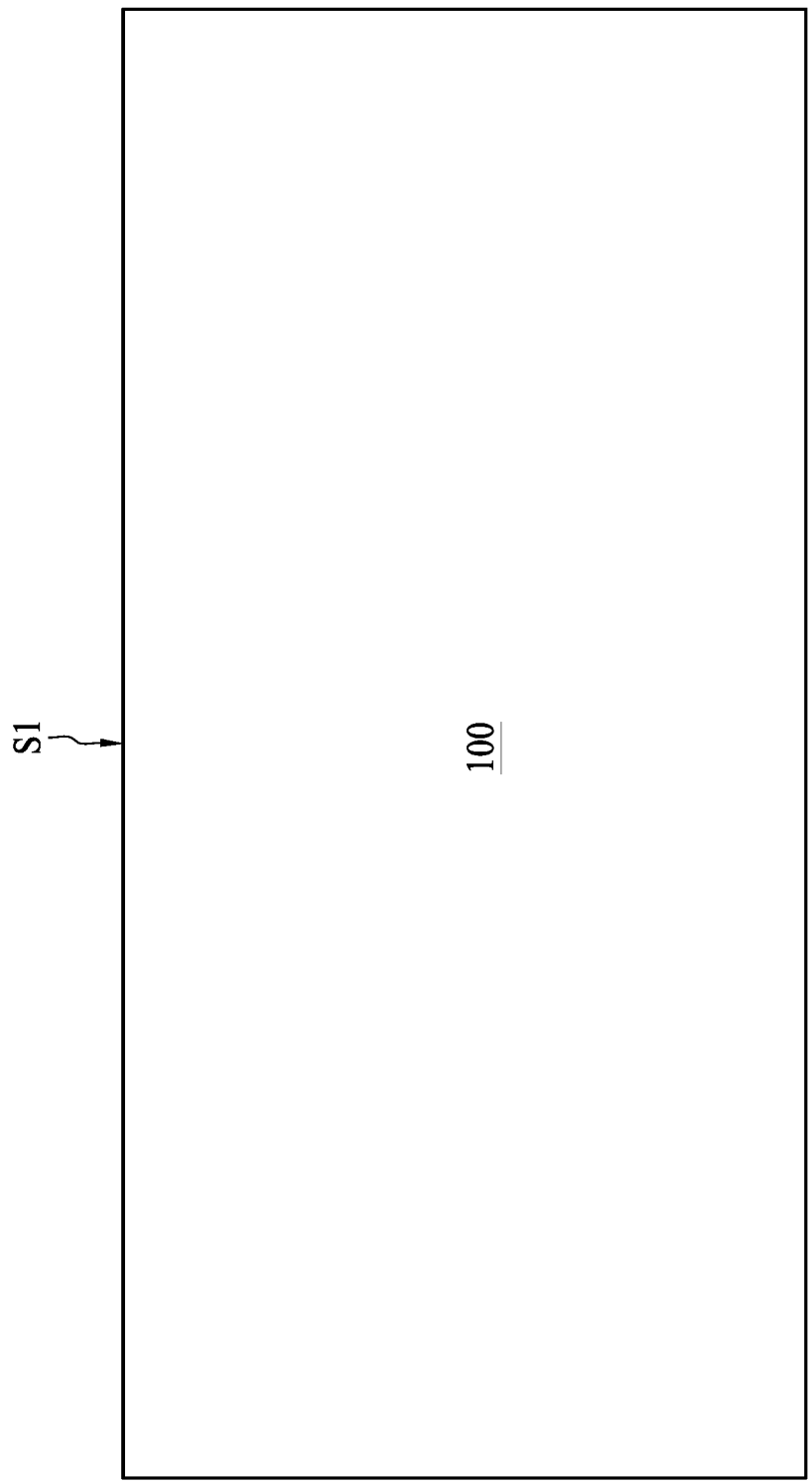
FIG. 5 to FIG. 21 are schematic cross-sectional views illustrating sequential fabrication stages according to the method in FIG. 4, in accordance with some embodiments of the present disclosure.
Figure 6:
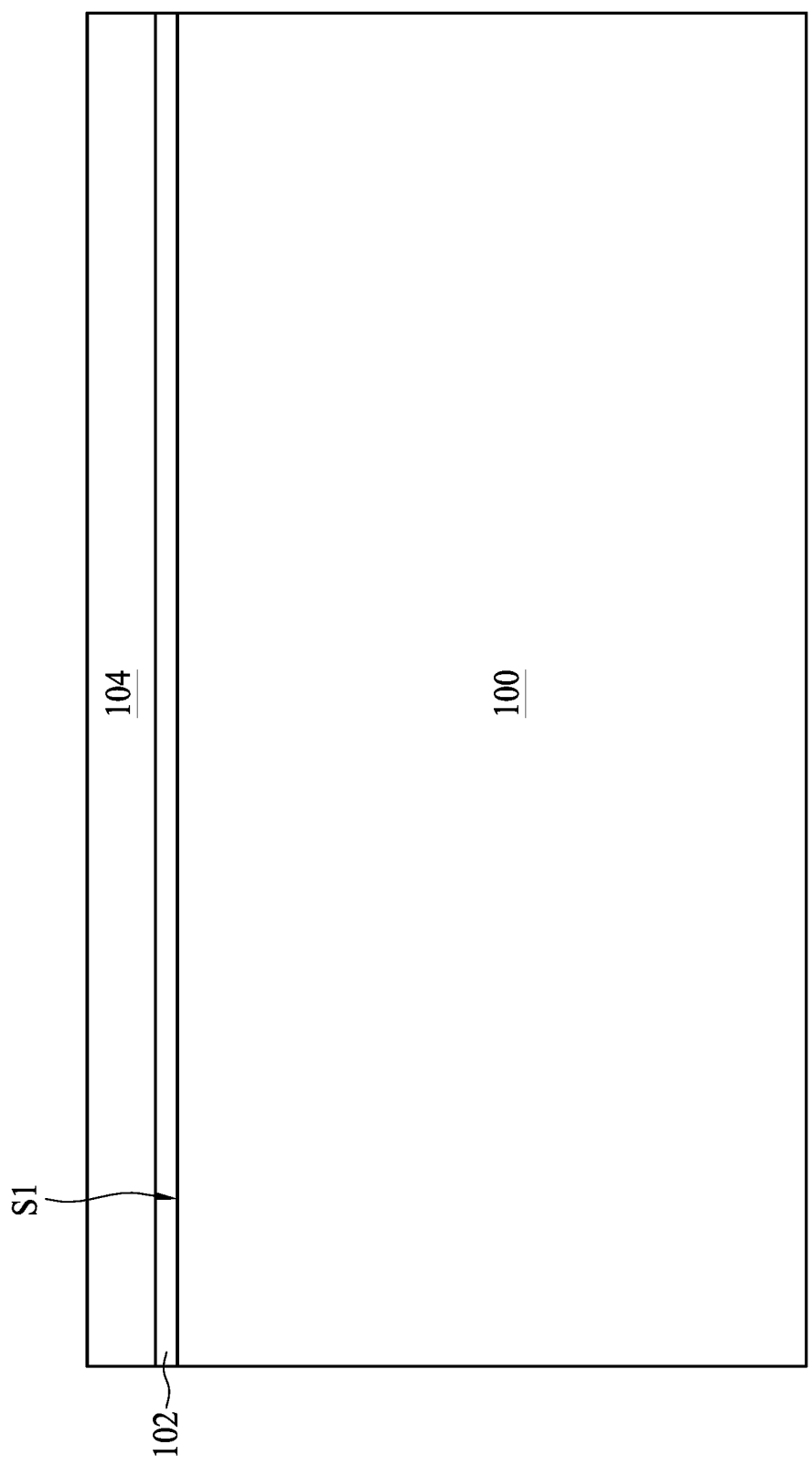

With reference to FIG. 5, a substrate 100 is provided according to step S101 in FIG. 3. In some embodiments, the substrate 100 may include single crystal silicon substrates, compound semiconductor substrates such as silicon germanium (SiGe) substrates, gallium arsenide (GaAs) substrates, silicon-on-insulator (SOI) substrates or other suitable substrates. The substrate 100 has a top surface S1.

With reference to FIG. 6 to FIG. 9, an active area definition process is performed on the substrate 100 according to step S103 in FIG. 3. In some embodiments, the active definition process is a shallow trench isolation (STI) formation process. First, referring to FIG. 6, a pad oxide layer 102 and a pad nitride layer 104 are sequentially formed on the top surface S1 of the substrate 100. In some embodiments, the pad oxide layer 102 includes silicon oxide ($SiO_2$) and the pad nitride layer 104 includes silicon nitride ($Si_3N_4$). It should be understood that the pad oxide layer 102 and the pad nitride layer 104 may be replaced with other suitable materials that provide high etching selectivity with respect to the substrate 100. In some embodiments, the pad oxide layer 102 can be deposited by conventional depositional processes, such as a chemical vapor deposition (CVD) process, or can be formed by thermally oxidizing a top thin portion of the substrate 100 in a furnace. The pad oxide layer 102 may be used to reduce an interfacial stress between the substrate 100 and the subsequently-formed pad nitride layer 104. In some embodiments, the pad nitride layer 104 is formed using a low-pressure chemical vapor deposition (LPCVD) process or a plasma-enhanced chemical vapor deposition (PECVD) process. The pad nitride layer 104 may be used as a barrier layer against water or oxygen molecules diffusing into the substrate.

Figure 7:
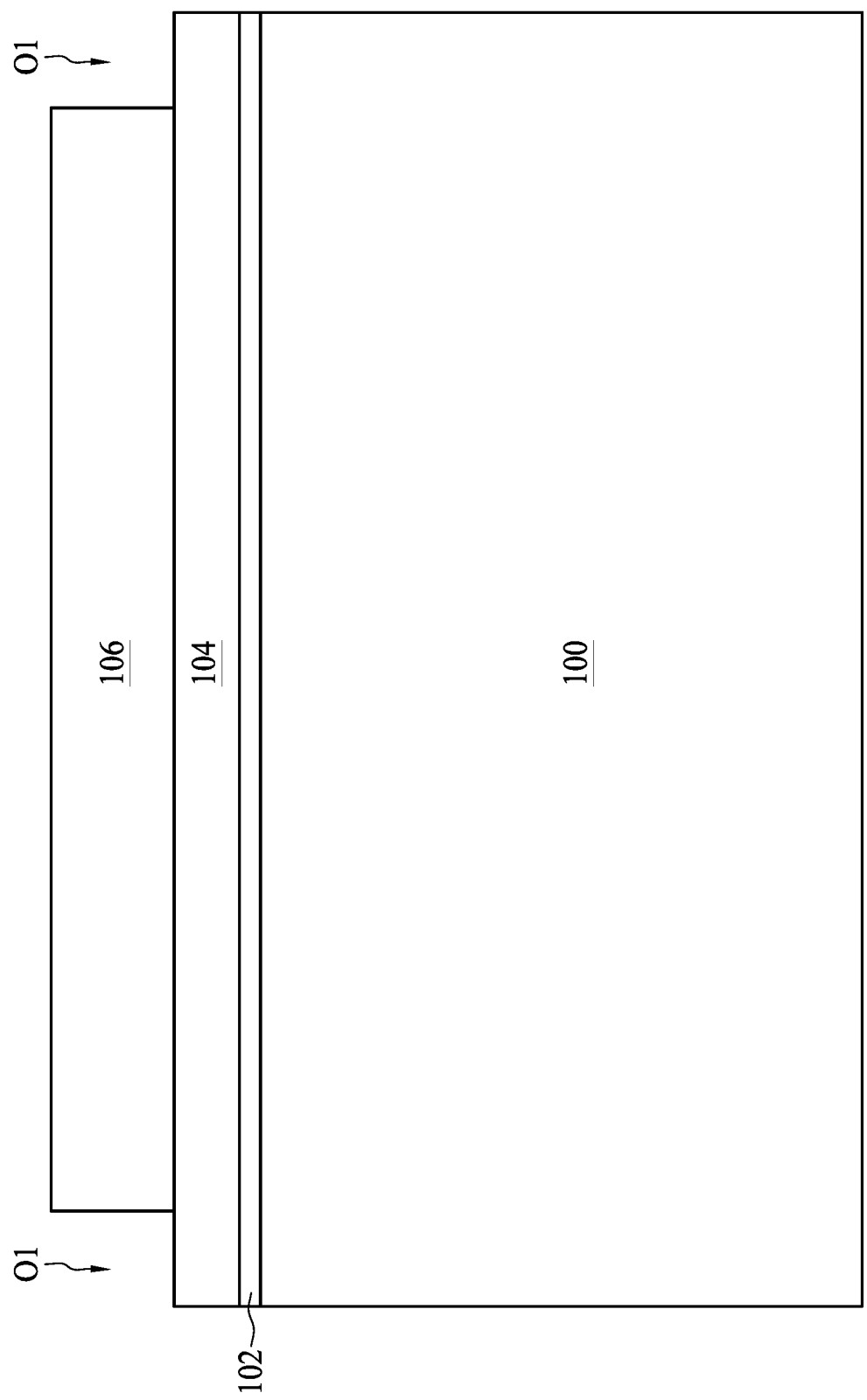

Next, referring to FIG. 7, a first photoresist pattern 106 is formed on the nitride layer 104 to define a location of an isolation region. In some embodiments, the first photoresist pattern 106 includes multiple first openings O1 exposing top surfaces of the pad nitride layer 104. Specifically, the formation of the first photoresist pattern 106 at least includes sequentially coating a first photoresist layer (not shown) on the pad nitride layer 104, exposing the first photoresist layer to a radiation using a first photomask (not shown) and a lithographic process, and developing the exposed first photoresist layer.

Figure 8:
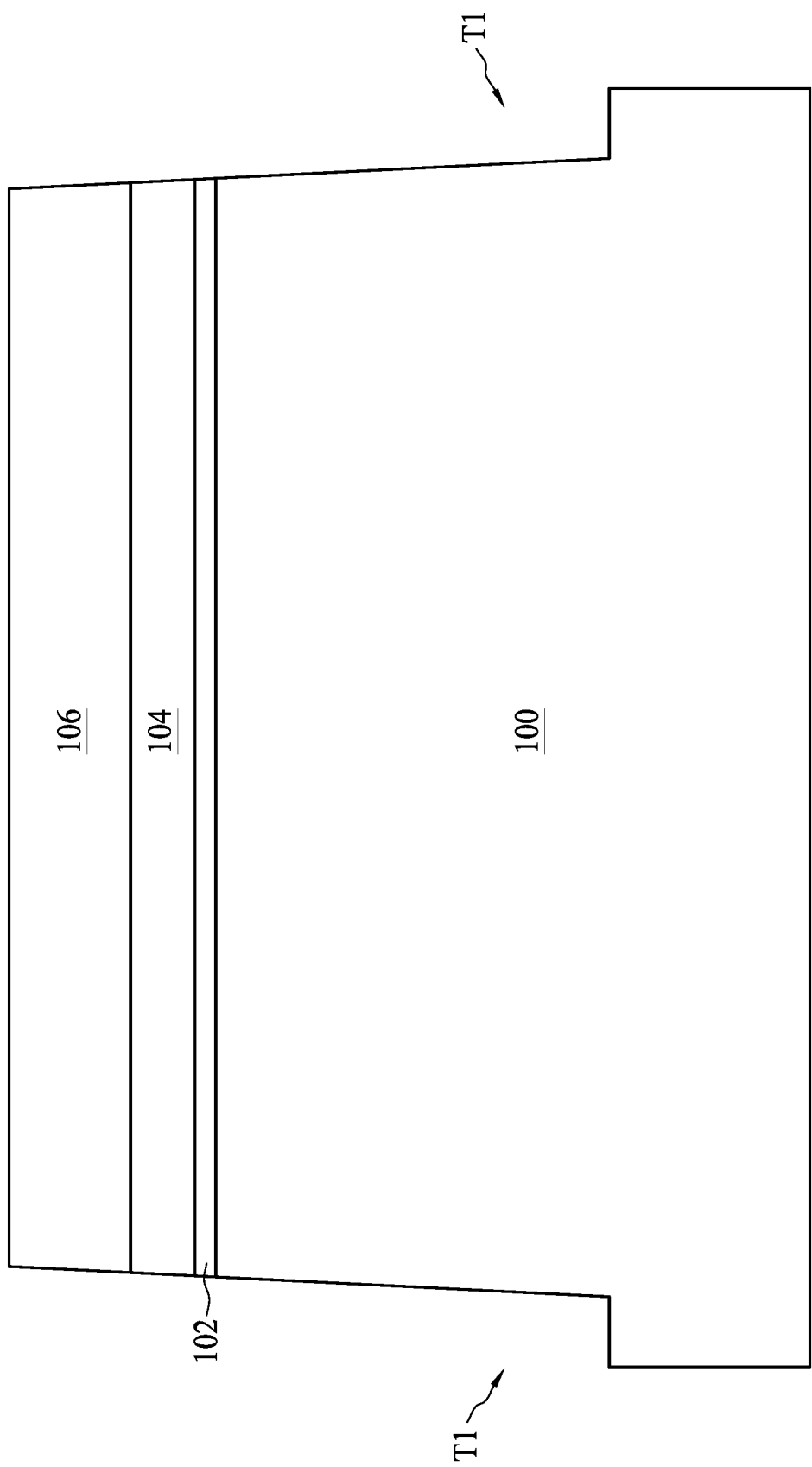

Subsequently, referring to FIG. 8, the substrate 100, the pad oxide layer 102 and the pad nitride layer 104 are etched using the first photoresist pattern 106 as an etching mask. Specifically, portions of the substrate 100, the pad oxide layer 102 and the pad nitride layer 104 exposed by the first openings O1 are removed. Therefore, an isolation trench T1 is formed in the substrate 100 and the first photoresist pattern 106 is then removed using an ashing process or a wet strip process.

Figure 9:
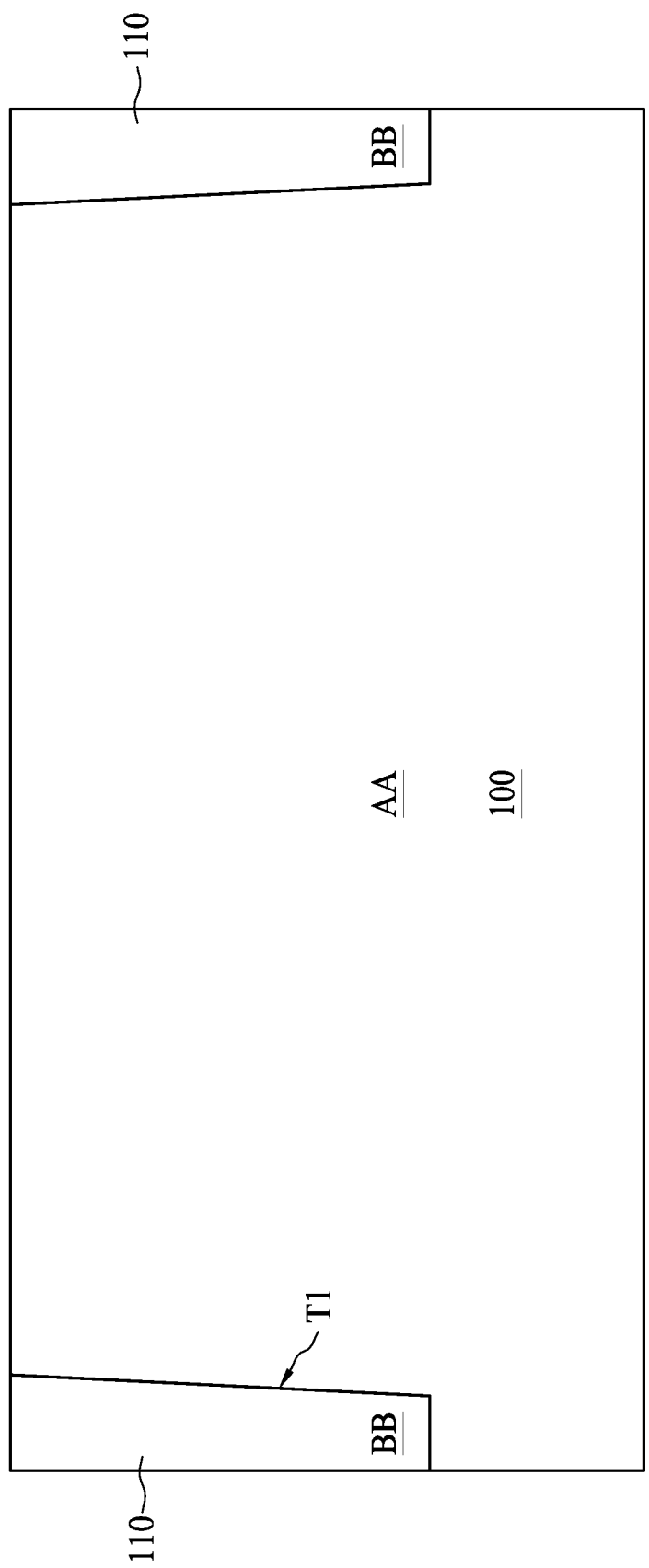

Next, referring to FIG. 9, the pad oxide layer 102 and the pad nitride layer 104 exposing the isolation trench T1 are removed using a wet strip process. At such time, the top surface S1 of the substrate 100 is exposed again. The isolation trench T1 is then filled with a dielectric material 110 using a CVD process or a spin-coating process. In some embodiments, the dielectric material 110 includes at least one of silicon dioxide ($SiO_2$), tetraethyl orthosilicate (TEOS), boron phosphorus silicate glass (BPSG), and undoped silicate glass (USG). After the isolation trench T1 is filled with the dielectric material 110, a chemical mechanical planarization (CMP) process may be performed to planarize a top surface of the dielectric material 110 so that the top surface of the dielectric material 110 does not protrude above the top surface S1 of the substrate 100.

Still referring to FIG. 9, the isolation trench T1 filled with the dielectric material 110 forms an isolation region BB. In some embodiments, the isolation region BB may be repetitively arranged at predetermined intervals in the substrate 100. In addition, an active region AA is surrounded by the isolation region BB.

Figure 10:
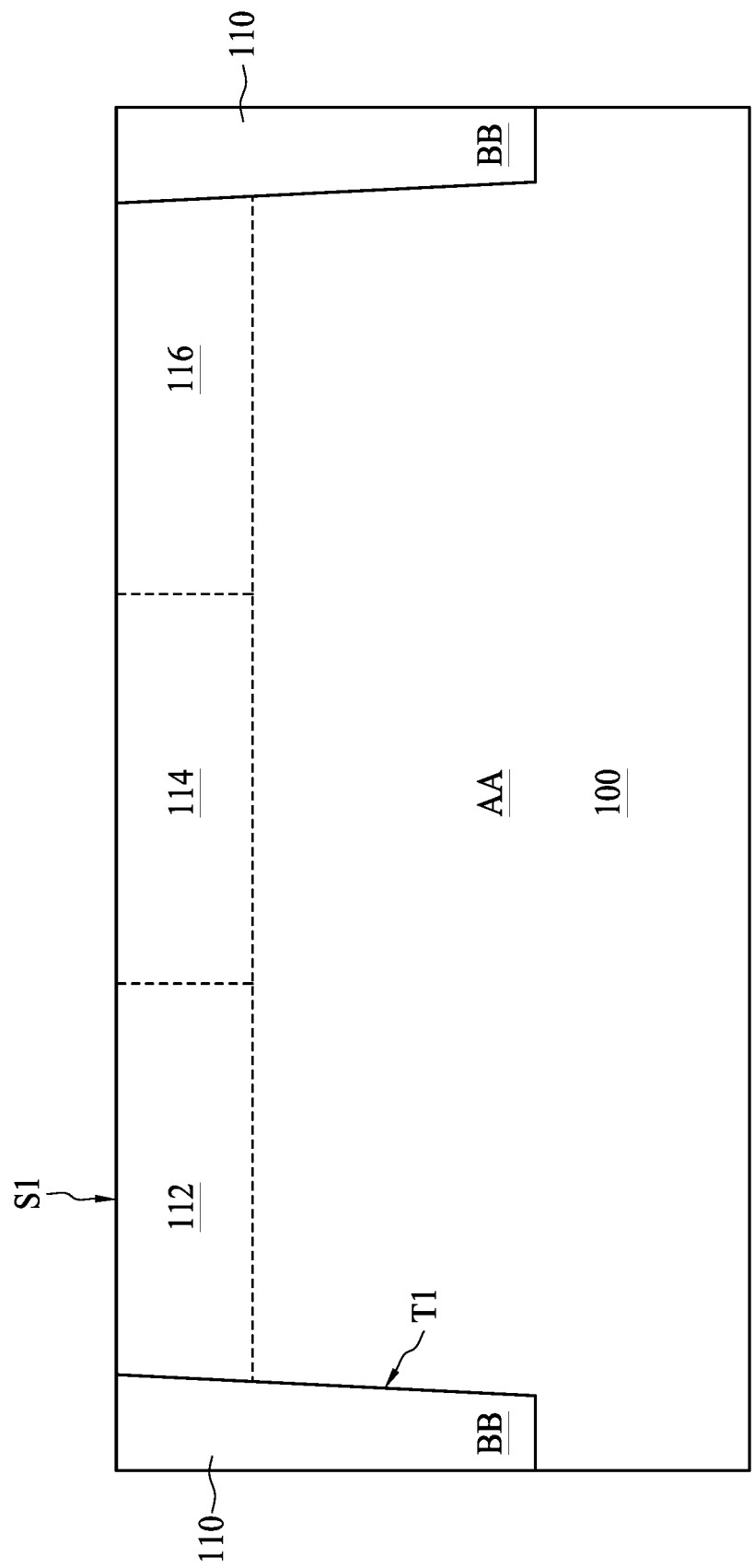

With reference to FIG. 10, an ion implantation process is performed on the substrate 100 according to step S105 in FIG. 3. Specifically, the ion implantation process may include one or more doping processes. For example, various dopants may be implanted into the substrate 100 to form a first impurity region 112, a second impurity region 114 and a third impurity region 116 in the active region AA. In some embodiments, bottom surfaces of the first impurity region 112, the second impurity region 114 and the third impurity region 116 are positioned at a predetermined depth from the top surface S1 of the substrate 100. In some embodiments, each of the first impurity region 112, the second impurity region 114 and the third impurity region 116 can be a p-type doped region when the dopant includes boron (B), gallium (Ga) or indium (In). In other embodiments, each of the first impurity region 112, the second impurity region 114 and the third impurity region 116 can be an n-type doped region when the dopant includes phosphorus (P) or arsenic (As). In one embodiment, the first impurity region 112 and the third impurity region 116 may be p-type while the second impurity region 114 is n-type. In still another embodiment, the first impurity region 112 and the third impurity region 116 may be n-type while the second impurity region 114 is p-type. In some embodiments, one or more annealing processes may be performed to repair the damage caused by the ion implantation process and activate the dopants.

Figure 11:
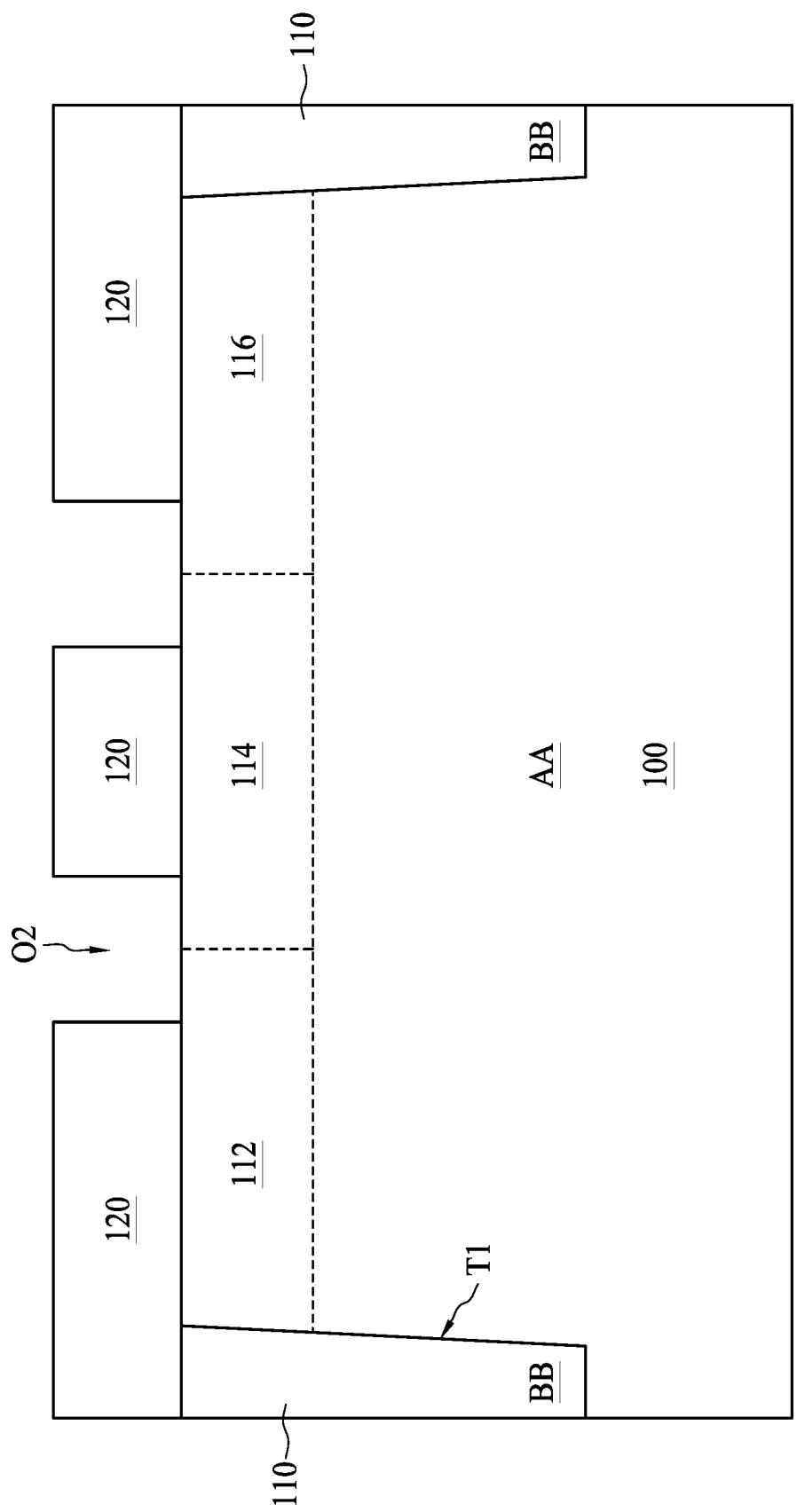
Figure 12:
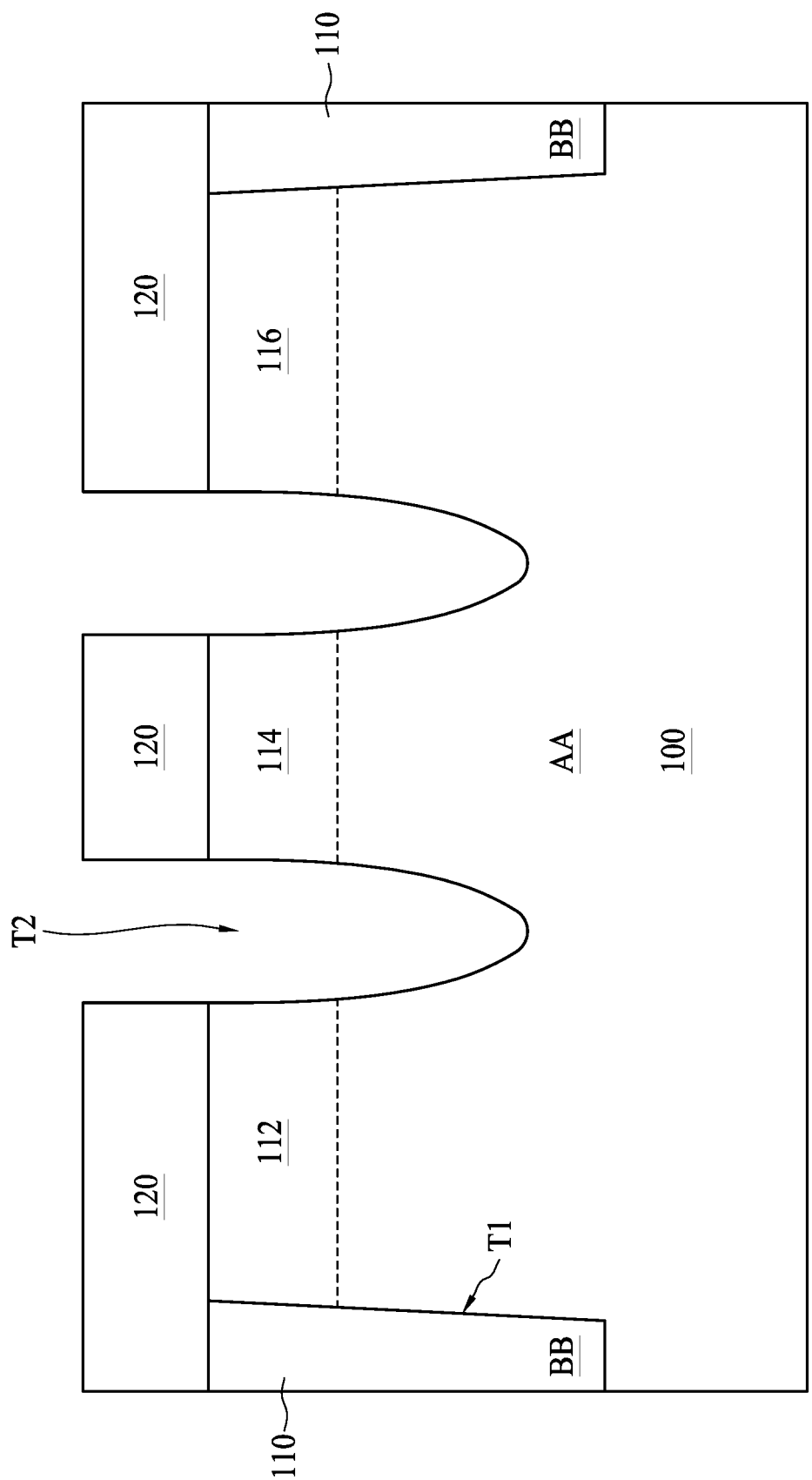

With reference to FIG. 11 to FIG. 12, a gate trench formation process is performed on the substrate 100 according to step S107 in FIG. 3. In some embodiments, the gate trench formation process is a recess formation process. First, referring to FIG. 11, a second photoresist pattern 120 is formed on the substrate 100 to define the location of recesses. In some embodiments, the second photoresist pattern 120 includes multiple second openings O2 exposing top surfaces of the first impurity region 112, the second impurity region 114 and the third impurity region 116. Specifically, the formation of the second photoresist pattern 120 at least includes sequentially coating a second photoresist layer (not shown) on the active region AA and the isolation region BB, exposing the second photoresist layer to a radiation using a second photomask (not shown) and a lithographic process, and developing the exposed second photoresist layer.

Next, referring to FIG. 12, the active region AA is etched using the second photoresist pattern 120 as an etching mask. Specifically, portions of the active region AA exposed by the second openings O2 are removed. Therefore, multiple gate trenches T2 are formed in the active region AA and the second photoresist pattern 120 is then removed using an ashing process or a wet strip process. In some embodiments, the depth of the gate trench T2 is less than that of the isolation trench T1. In some embodiments, the bottom surfaces of the first impurity region 112, the second impurity region 114 and the third impurity region 116 are higher than the bottom surface of the gate trench T2. In some embodiments, the gate trench T2 is a line-type channel that extends in any one direction in the active region AA. Therefore, the first impurity region 112 and the second impurity region 114 are divided by one of the gate trenches T2, and the second impurity region 114 and the third impurity region 116 is divided by the other gate trench T2.

Figure 13:
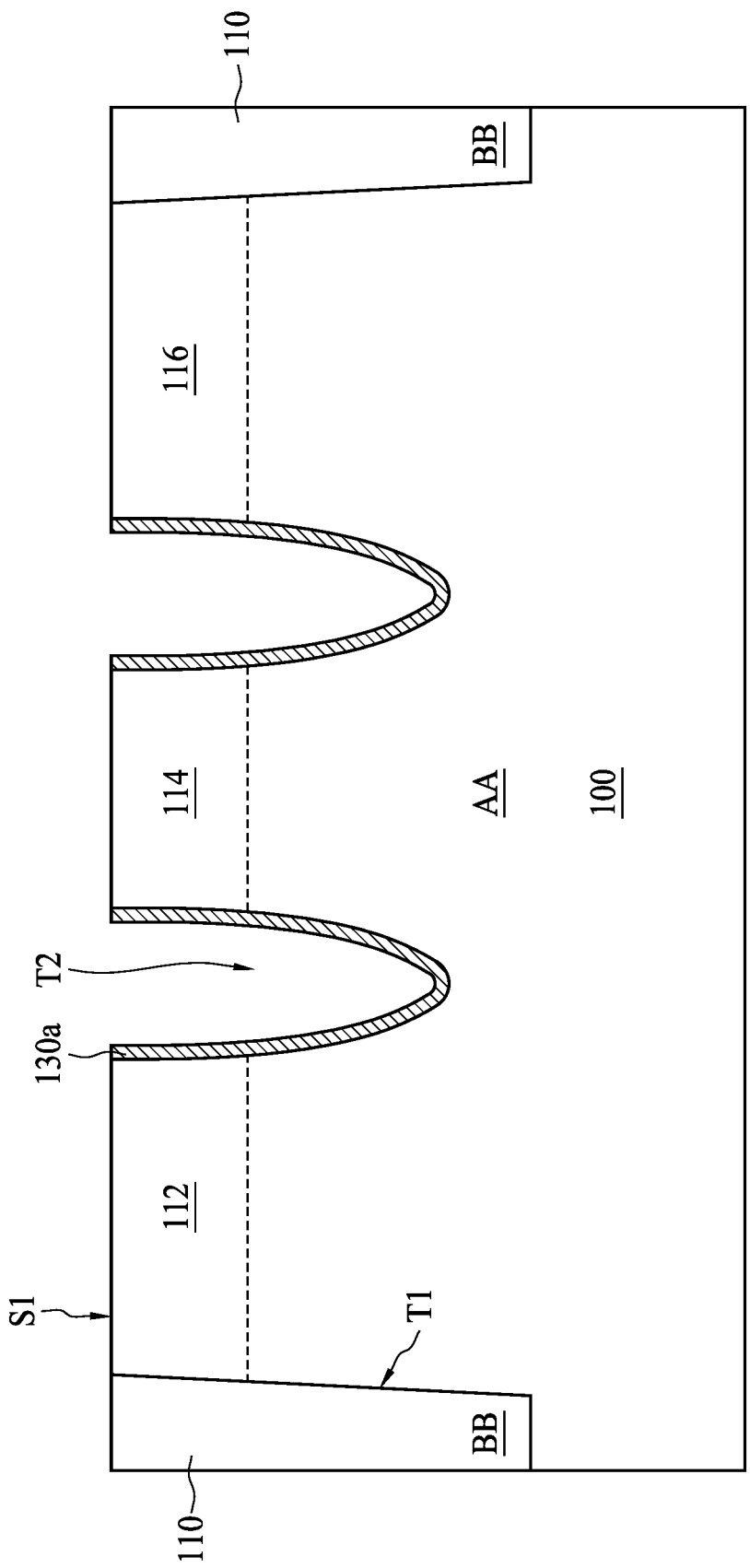

With reference to FIG. 13, a first barrier layer 130*a* is formed on the substrate 100 according to step S109 in FIG. 3. Specifically, first, the first barrier layer 130*a* is deposited over the active region AA and the isolation region BB and conformally formed within the gate trench T2. Next, a CMP process is performed to remove portions of the first barrier layer 130*a* over the top surface S1. As a result, remaining portions of the first barrier layer 130*a* line the inner sidewalls of the gate trenches T2. In some embodiments, the first barrier layer 130*a* is formed using a CVD process. Preferably, the first barrier layer 130*a* is formed using an atomic layer deposition (ALD) process to allow for formation of a highly conformal barrier layer having a more uniform thickness. In some embodiments, the first barrier layer 130*a* includes various materials such as tantalum (Ta), titanium (Ti), tantalum nitride (TaN), titanium nitride (TiN), titanium silicon nitride (TiSiN) or other suitable materials chosen for compatibility.

Figure 14:
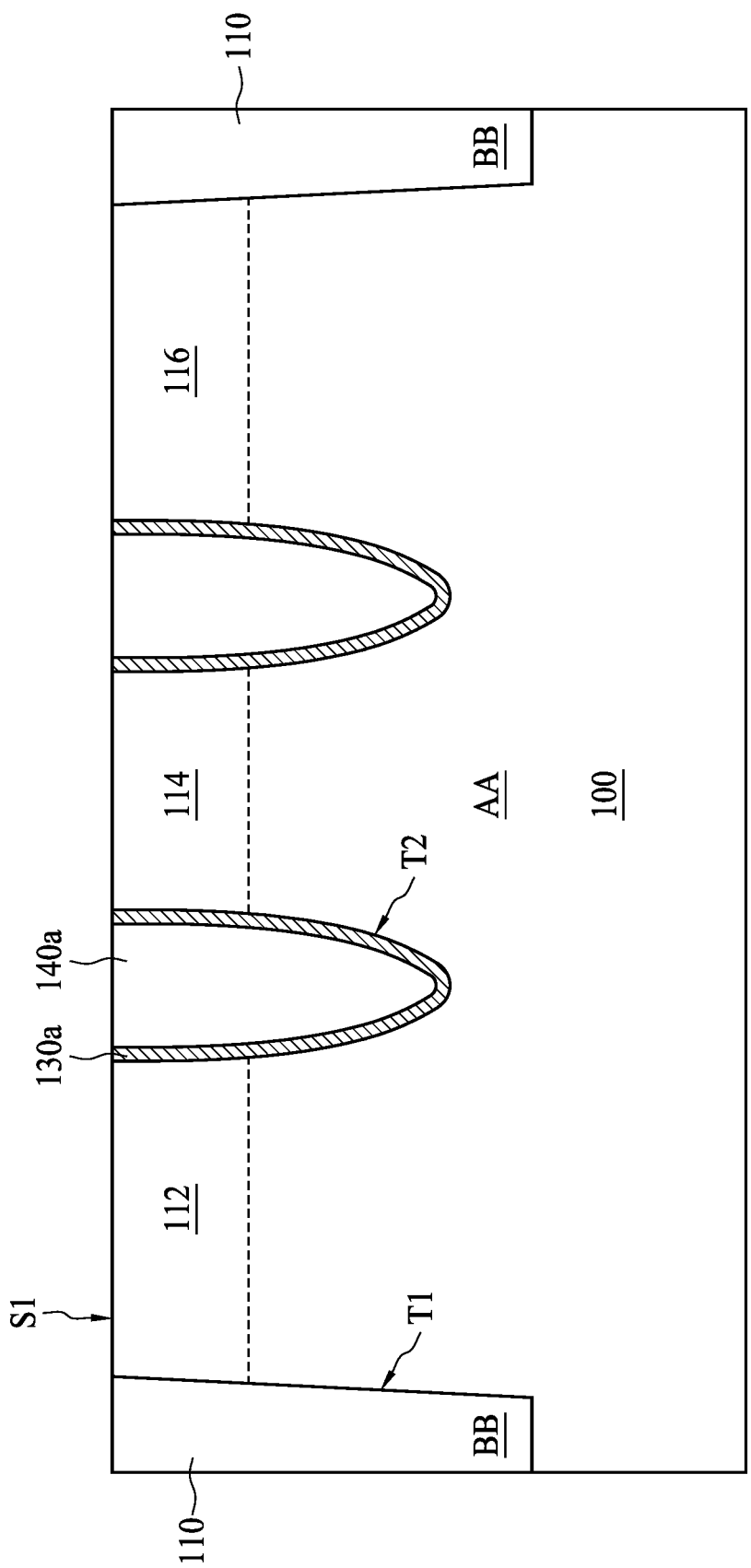
Figure 15:
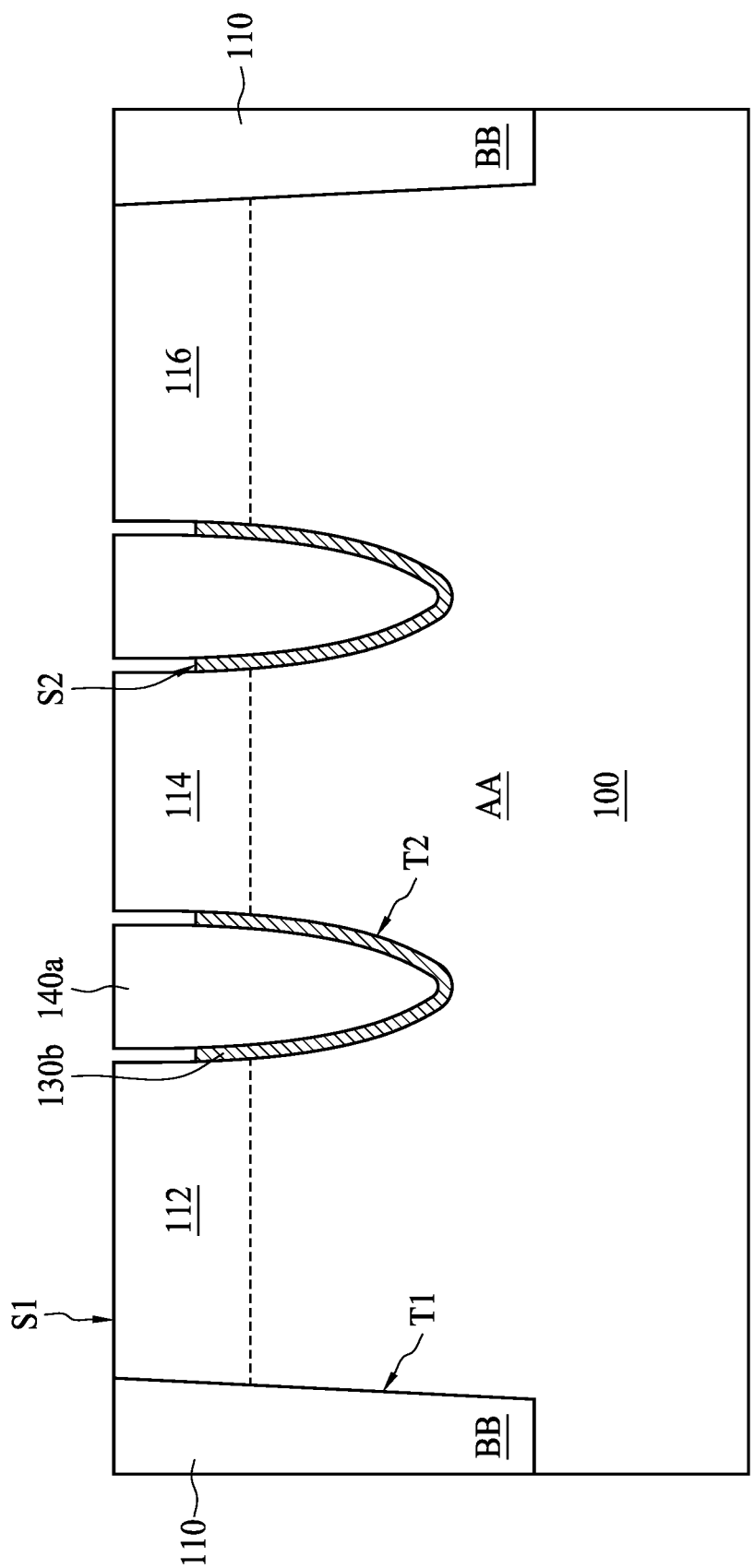

With reference to FIG. 14, a first gate material 140*a* is formed on the substrate 100 according to step S111 in FIG. 3. Specifically, first, the first gate material 140*a* is deposited over the active region AA and the isolation region BB and completely fills the gate trench T2. Next, a CMP process is performed to remove the first gate material 140*a* over the top surface S1. As a result, the remaining first gate material 140*a* surrounded by the first barrier layer 130*a* completely fills the gate trench T2 in the active region AA. In some embodiments, the first gate material 140*a* may be formed using a CVD process, a physical vapor deposition (PVD) process or an electroplating process. In some embodiments, the first gate material 140*a* includes various metals such as aluminum (Al), copper (Cu), tungsten (W), titanium (Ti) or other suitable materials with a proper work function. In some embodiments, before the first gate material 140*a* is deposited over the first barrier layer 130*a*, a metal seed layer (not shown) is conformally formed on the first barrier layer 130*a* to improve the adhesion between the first barrier layer 130*a* and the subsequently-formed first gate material 140*a*. The material of the metal seed layer is selected according to the material chosen for the first gate material 140*a*.

With reference to FIG. 15 to FIG. 18, a recess is produced within the gate trench T2 according to step S113 in FIG. 3. In some embodiments, the first barrier layer 130*a* and the first gate material 140*a* are sequentially recessed and shaped to different profiles. First, referring to FIG. 15, portions of the first barrier layer 130*a* are removed using a first etching process such that a remaining first barrier layer 130*b* is left. In some embodiments, the first barrier layer 130*b* has a top surface S2 lower than the top surface S1 of the substrate 100.

Figure 16:
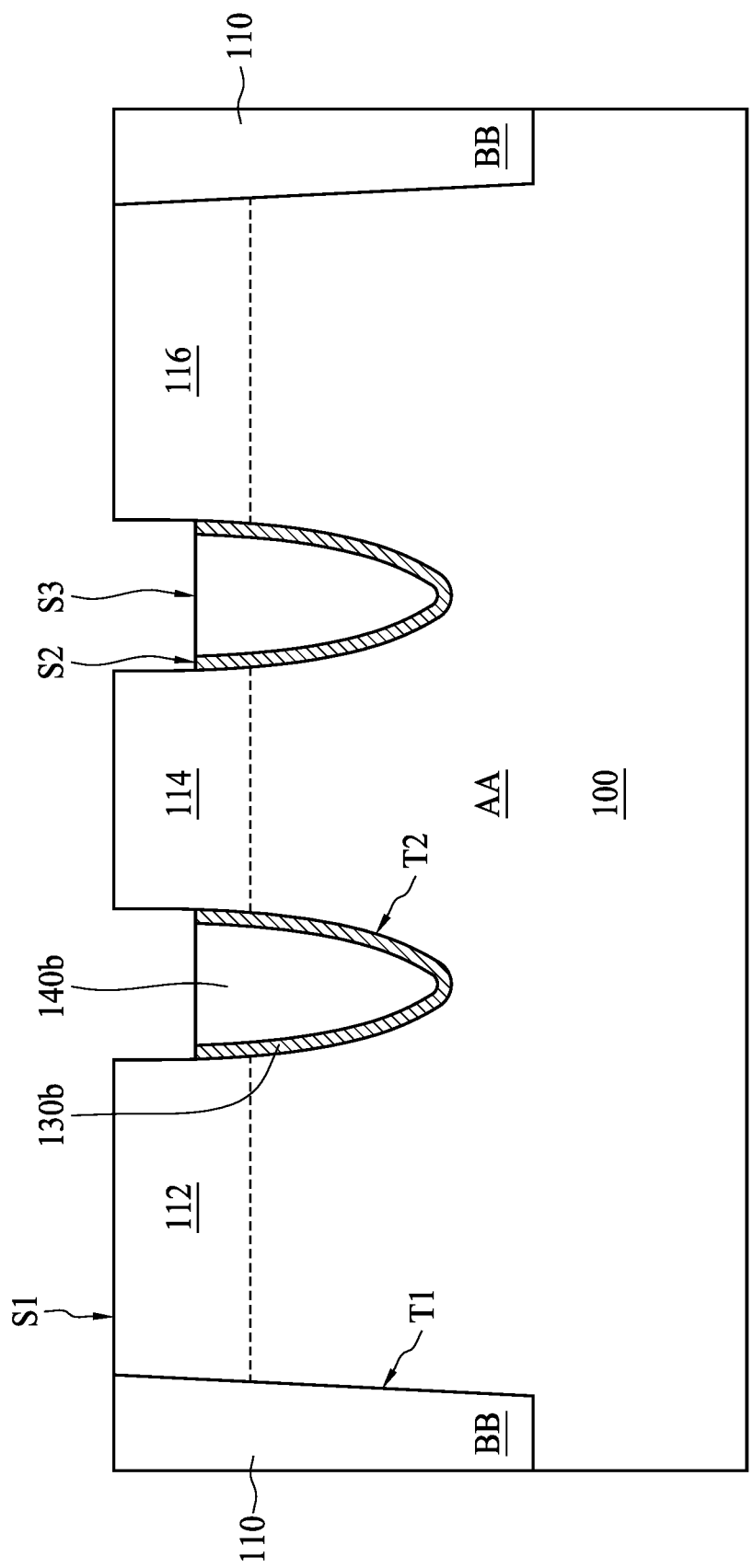

Next, referring to FIG. 16, a portion of the first gate material 140*a* is removed using a second etching process such that a remaining first gate material 140*b* is left. In some embodiments, the second etching process uses an etchant different from that used in the first etching process. The second etching process is an anisotropic etching that vertically removes about one-third of the height of the first gate material 140*a*. In some embodiments, after the second etching process, the first gate material 140*b* has a top surface S3 substantially coplanar with the top surface S2 of the first barrier layer 130*b*.

Figure 17:
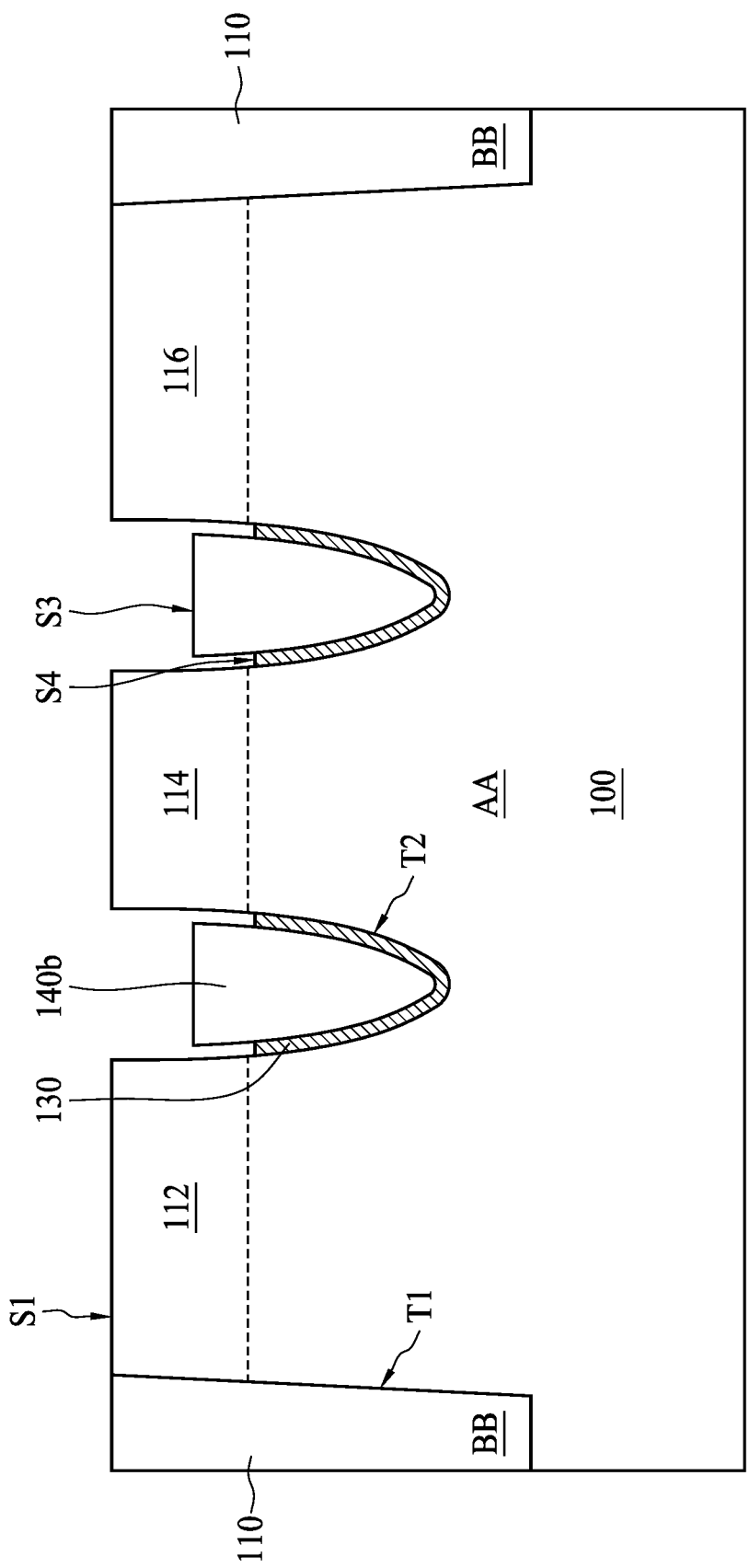

Subsequently, referring to FIG. 17, portions of the first barrier layer 130*b* are removed using a third etching process such that a remaining first barrier layer 130 is left. In some embodiments, the third etching process uses the same etchant as that of the first etching process. In some embodiments, after the third etching process, the first barrier layer 130 has a top surface S4 substantially lower than the top surface S3 of the first gate material 140*b*.

Figure 18:
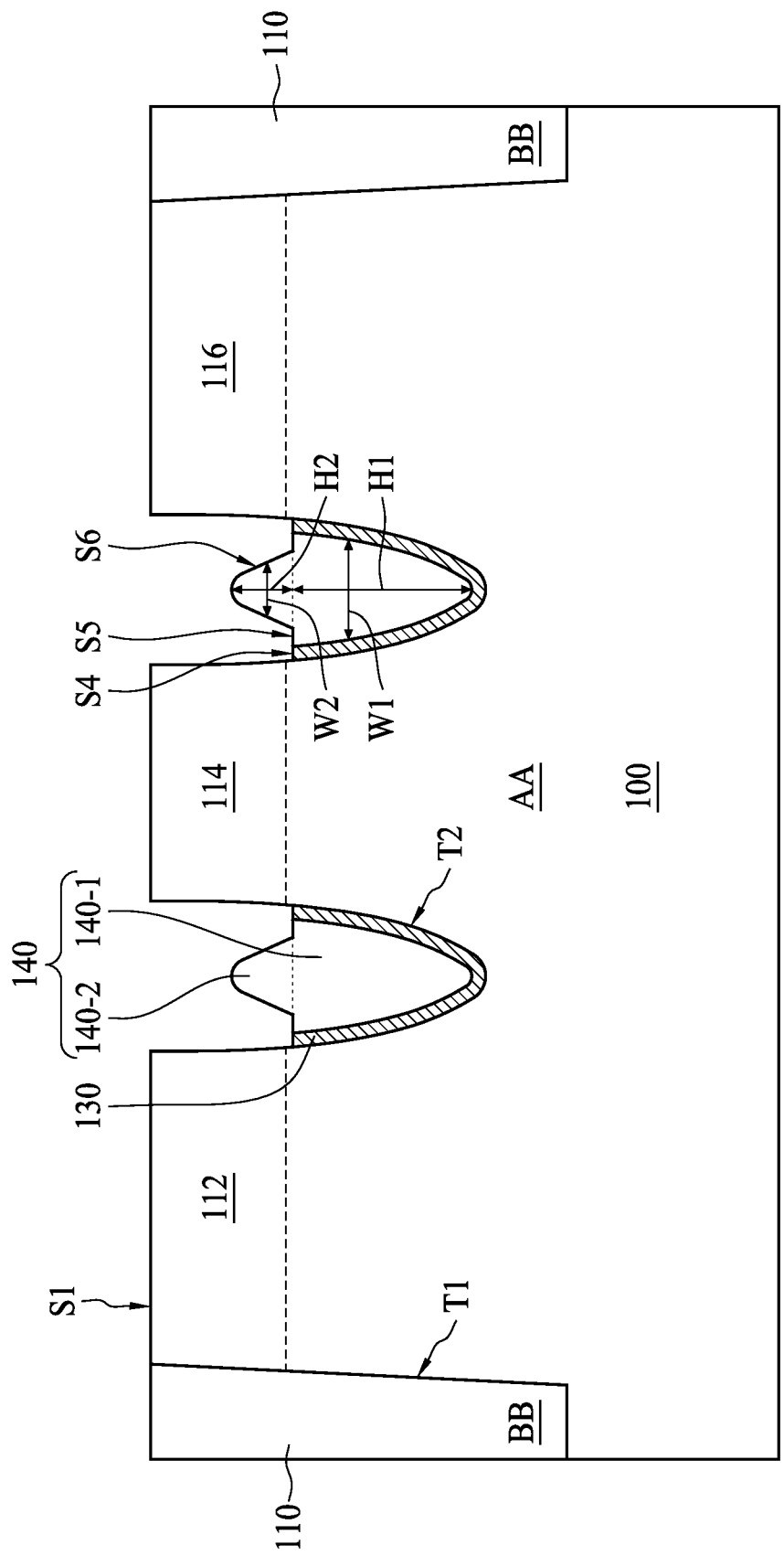

Next, referring to FIG. 18, a portion of the first gate material 140*b* is removed using a fourth etching process such that a remaining first gate material 140 is left. In some embodiments, the fourth etching process uses the same etchant as that of the second etching process. The fourth etching process mainly etches sidewalls of the first gate material 140b above the level of the top surface S4 and rounds an upper portion of the first gate material 140b. Comparing FIG. 14 and FIG. 18, the first gate material 140a is etched to the mound-shaped first gate material 140. Specifically, the first gate material 140 includes a first member 140-1 and a second member 140-2 centrally located on the first member 140-1. The second member 140-2 extends from the first member 140-1 toward the top surface S1 of the substrate 100. In some embodiments, the first member 140-1 basically has a hemi-ellipsoid profile and the second member 140-2 basically has a bell-shaped profile. In some embodiments, the first member 140-1 and the second member 140-2 have different dimensions. In some embodiments, the first member 140-1 has a first width W1 varied with a first height H1 along the vertical extension of the first member 140-1. In some embodiments, the second member 140-2 has a second width W2 varied with a second height H2 along the vertical extension of the second member 140-2. In some embodiments, the first member 140-1 has a substantially planar top surface S5 adjacent to and coplanar with the top surface S4 of the first barrier layer 130. In some embodiments, the second member 140-2 has a substantially convex top surface S6 surrounded by and extending from the top surface S5. The first member 140-1 is surrounded by the first barrier layer 130 while the second member 140-2 is not covered by any barrier layer. At such time, the recess produced within the gate trench T2 is generally finished.

Figure 19:
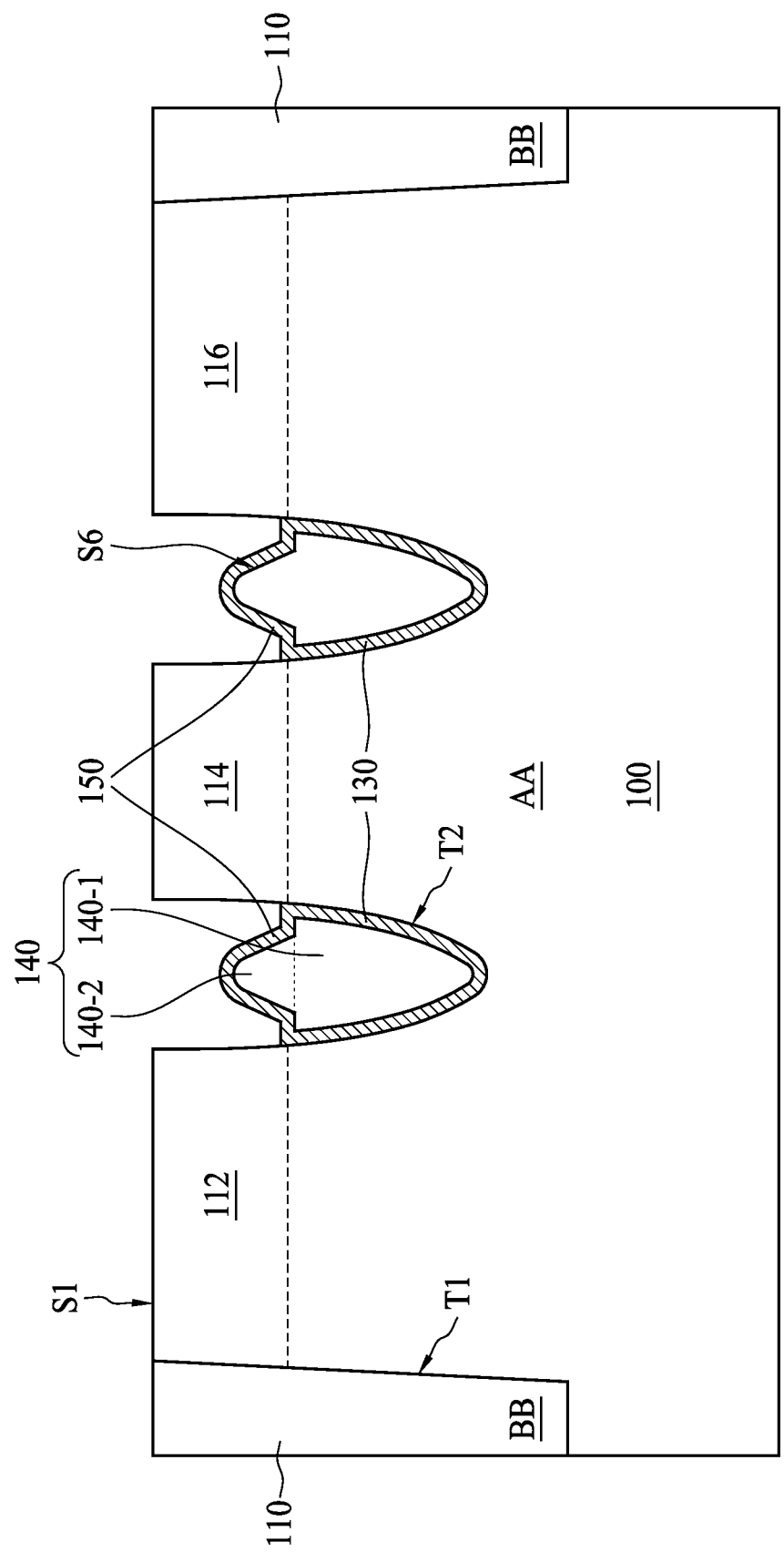

With reference to FIG. 19, a second barrier layer 150 is formed on the substrate 100 according to step S115 in FIG. 3. Specifically, the top surface S5 of the first member 140-1 and the top surface S6 of the second member 140-2 are covered by the second barrier layer 150. As a result, the first gate material 140 is completely encased by the first barrier layer 130 and the second barrier layer 150. In some embodiments, the second barrier layer 150 may include the same material formed using the same process as those of the first barrier layer 130.

Figure 20:
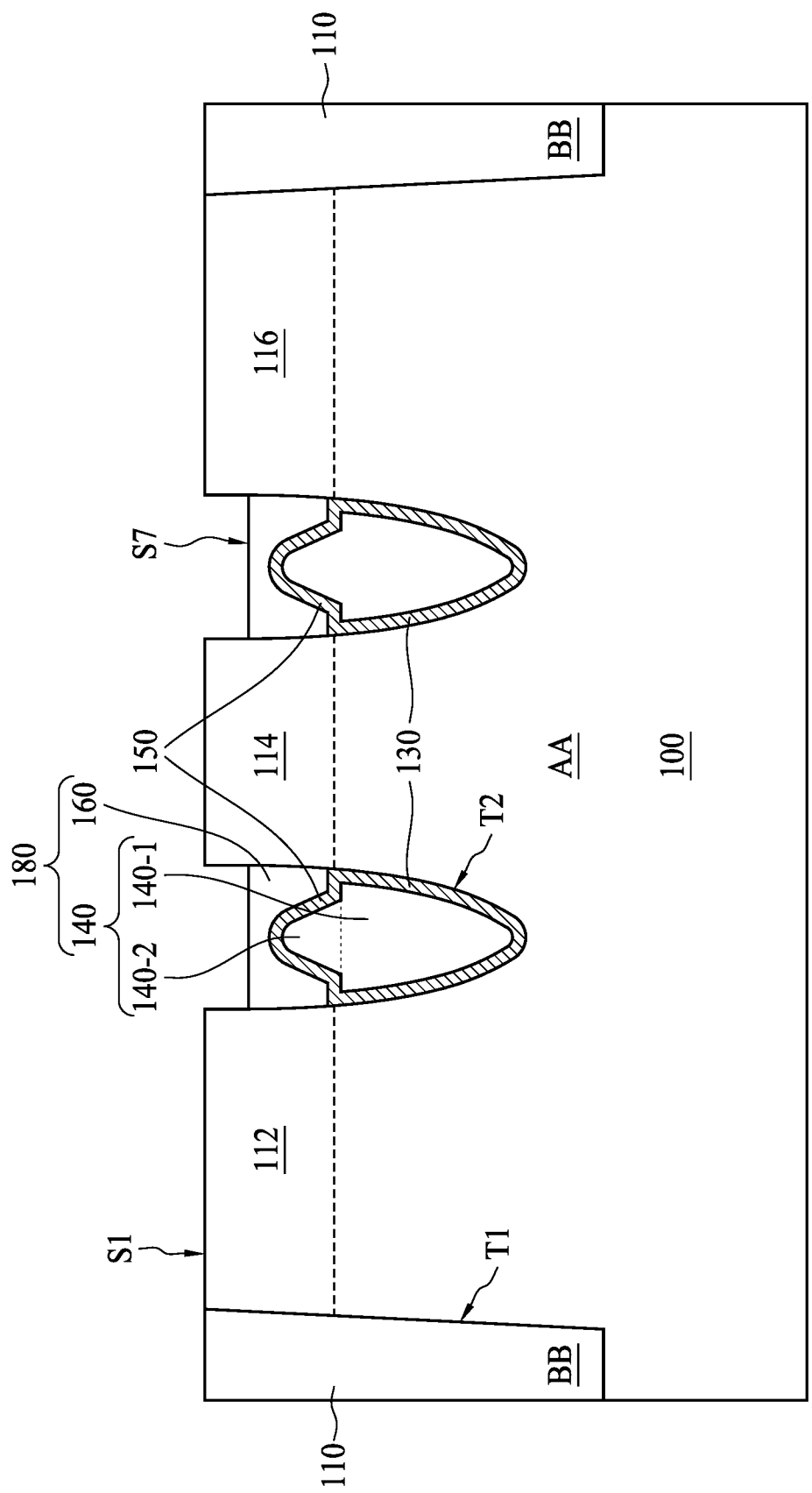

With reference to FIG. 20, a second gate material 160 is formed on the substrate 100 according to step S117 in FIG. 3. Specifically, the second gate material 160 is deposited to completely cover the first gate material 140 and partially fills the gate trench T2. In some embodiments, the second gate material 160 has a top surface S7 substantially lower than the top surface S1 of the substrate 100. In some embodiments, the second gate material 160 may include doped or undoped polycrystalline silicon formed using an LPCVD process. Preferably, the second gate material 160 is polycrystalline silicon doped with an impurity such that the resistance of the second gate material 160 can be decreased. In some embodiments, the resistance of the first gate material 140 is lower than that of the second gate material 160. In some embodiments, the work function of the first gate material 140 is greater than that of the second gate material 160. In some embodiments, the first gate material 140 is used as a metal gate electrode and the second gate material 160 is used as a polysilicon gate electrode. The metal gate electrode and the polysilicon gate electrode may together form a buried dual gate electrode in a transistor in a DRAM device. In some embodiments, a buried gate electrode 180 including the first gate material 140 and the second gate material 160 is formed within the gate trench T2 and functions as the transistor, wherein the buried gate electrode 180 has dual work functions. In the buried gate electrode 180, the second member 140-2 of the first gate material 140 extends toward the second gate material 160. The second barrier layer 150 is interposed between the second gate material 160 and the first gate material 140. The first barrier layer 130 and the second barrier layer 150 completely separate the first gate material 140 and the second gate material 160. Therefore, the reaction between the first gate material 140 and the second gate material 160 to form metal silicide can be prevented. In addition, the first barrier layer 130 and the second barrier layer 150 prevent mutual ion diffusion between the buried gate electrode 180 and the impurity regions.

Figure 21:
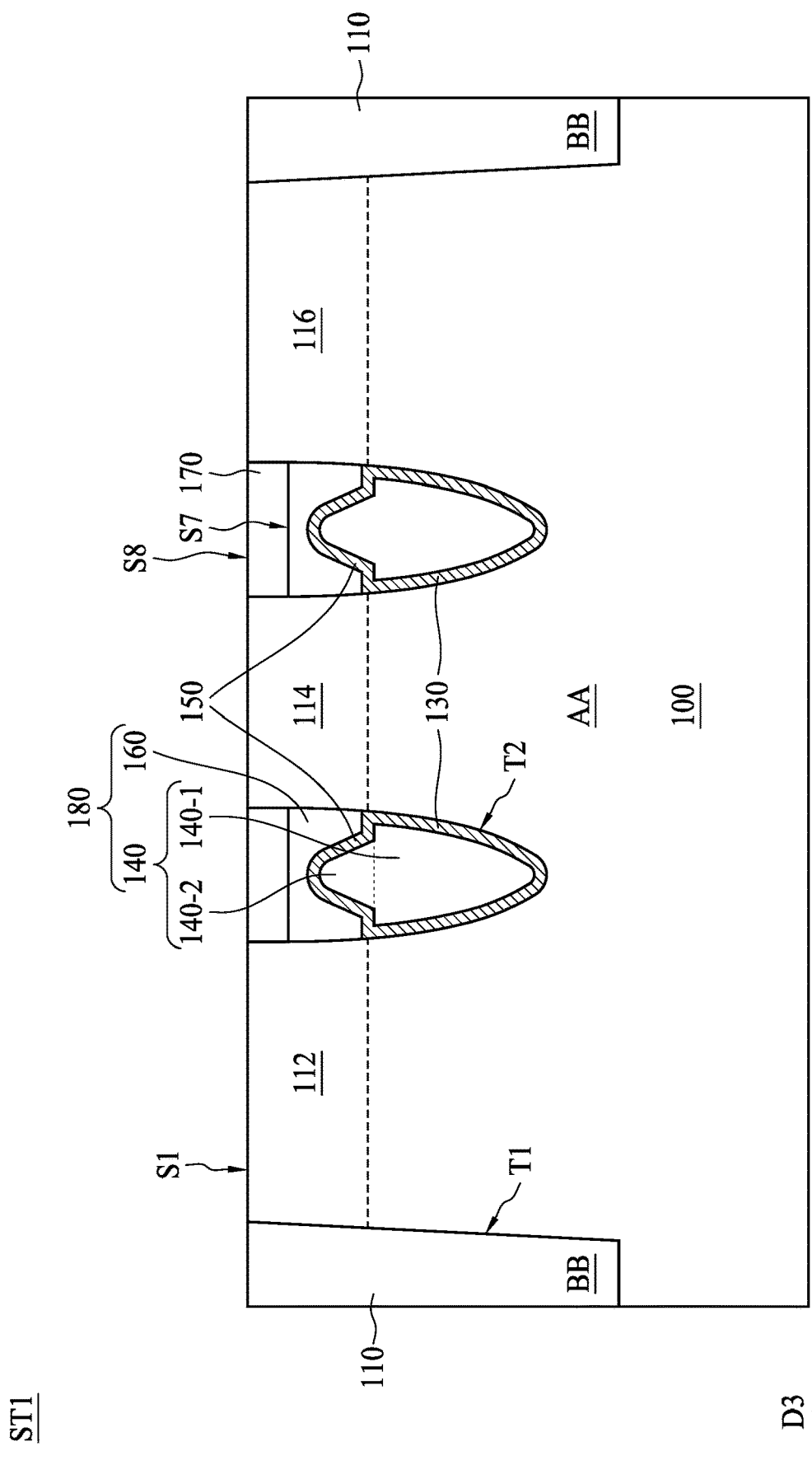

With reference to FIG. 21, a gate insulating material 170 is formed on the substrate 100 according to step S119 in FIG. 3. Specifically, the gate insulating material 170 is deposited to completely cover the second gate material 160 and partially fills the gate trench T2. In some embodiments, the gate insulating material 170 has a top surface S8 substantially coplanar with the top surface S1 of the substrate 100. In some embodiments, the gate insulating material 170 may be formed using a CVD process. In some embodiments, the gate insulating material 170 includes a dielectric material such as silicon nitride ($Si_3N_4$) or other suitable materials. The gate insulating material 170 may protect the buried gate electrode 180 and prevent an electrical short circuit from occurring. At such time, a first semiconductor structure ST1 is generally formed. The first semiconductor structure ST1 includes a buried gate electrode 180 with dual work functions. More importantly, the buried gate electrode 180 includes a protruding member of the metal gate electrode.

Still referring to FIG. 21, in some embodiments, the dual-work-function buried gate electrode 180 may serve as a gate terminal of the transistor. The first impurity region 112 and the second impurity region 114, or the second impurity region 114 and the third impurity region 116, may serve as a source terminal and a drain terminal of the transistor. In some embodiments, the buried gate electrode 180 with its adjacent impurity regions may be referred to as a buried word line in the DRAM device. In some embodiments, the buried gate electrode 180 extends in a first direction D1 in the active region AA. In addition, multiple buried gate structures 180 may be arranged in parallel along a second direction D2 substantially perpendicular to the first direction D1. In some embodiments, a bit line contact (not shown) may be formed on the first impurity region 112, the second impurity region 114 or the third impurity region 116 and extends in a third direction D3 substantially perpendicular to both the first direction D1 and the second direction D2. In some embodiments, a capacitor structure (not shown) may be formed over the buried gate electrode 180.

In some embodiments, the method 200 in FIG. 4 can also be used to fabricate a second semiconductor structure ST2 shown in FIG. 3. The second semiconductor structure ST2 is basically the same as the first semiconductor structure ST1 except that the shape of a second member 140-3 of the second semiconductor structure ST2 is different from the shape of the second member 140-2 of the first semiconductor structure ST1. In some embodiments, the difference can be made by adjusting the parameters such as etching rates, etching angles, etching temperatures, etching periods and the like of the first to fourth etching processes. In the second semiconductor structure ST2, the second member 140-3 has a substantially consistent width D1 along its vertical extension. In addition, a sidewall of the second member 140-3 is substantially perpendicular to the top surface of the first member 140-1.

The present disclosure provides a semiconductor structure including a buried dual gate electrode. The buried dual gate electrode includes a metal gate electrode and a polysilicon gate electrode disposed on the metal gate electrode, wherein the metal gate electrode includes a protruding member, which makes the metal gate electrode mound-shaped. Comparing FIG. 1 to FIG. 2, or FIG. 1 to FIG. 3, when keeping all else equal, the volume of the first gate material 50 in the semiconductor structure STA of the comparative embodiment is much less than the volume of the first gate material 140 in the semiconductor structure ST1 of FIG. 2 or the volume of the first gate material 140 in the semiconductor structure ST2 of FIG. 3. Specifically, the first gate material 140 retains the second member 140-2 or 140-3 extending from the first member 140-1 toward the top surface S1 of the substrate 100 such that the amount of material of the metal gate electrode is not significantly reduced. The protruding member of the first gate material 140 allows the removal of a portion of the metal gate electrode, i.e., the polysilicon gate electrode, to produce space for the second gate material 160, without removing an excessive amount of the metal gate electrode. As a result, the GIDL can be suppressed because of the low work function of the polysilicon gate electrode. Meanwhile, the total gate resistance of the buried gate electrode is prevented from increasing as much as that of the comparative embodiment due to the greater amount of the metal gate electrode.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method for preparing a semiconductor structure, comprising:
providing a substrate comprising a first top surface;
forming an isolation region in the substrate to surround an active region;
implanting a plurality of dopants into the substrate to form a first impurity region, a second impurity region and a third impurity region in the active region;
forming a gate trench in the active region;
forming a first barrier layer on a portion of a sidewall of the gate trench;
forming a first gate material in the gate trench, wherein the first gate material comprises a first member surrounded by the first barrier layer and a second member extending from the first member toward the first top surface and protruding out of the first barrier layer;
forming a second barrier layer on the first barrier layer and the first gate material;
forming a second gate material on the second barrier layer at a position that the second gate material surrounds the second barrier layer and the second member of the first gate material; and
forming a gate insulating material on the second gate material.

2. The method according to claim 1, wherein the formation of the first barrier layer comprises:
conformally depositing the first barrier layer within the gate trench; and
removing a portion of the first barrier layer within the gate trench.

3. The method according to claim 1, wherein the formation of the first gate material comprises:
depositing the first gate material to completely fill the gate trench; and
removing a portion of the first gate material within the gate trench to form the first member and the second member.

4. The method according to claim 2, wherein the removal of a portion of the first barrier layer includes using a first etchant, and the removal of a portion of the first gate material includes using a second etchant, wherein the first etchant is different from the second etchant.

5. The method according to claim 2, wherein the forming of the second barrier layer comprises encasing the first gate material in the first barrier layer and the second barrier layer.

6. The method according to claim 2, wherein the forming of the second gate material comprises depositing the second gate material to completely cover the first gate material and partially fill the gate trench, wherein the second gate material has a second top surface substantially lower than the first top surface of the substrate.

7. The method according to claim 2, wherein the forming of the gate insulating material comprises depositing the gate insulating material to completely cover the second gate material and partially fill the gate trench, wherein the gate insulating material has a third top surface substantially coplanar with the first top surface of the substrate.

* * * * *